(12) United States Patent
Menard et al.

(10) Patent No.: US 10,416,425 B2
(45) Date of Patent: Sep. 17, 2019

(54) CONCENTRATOR-TYPE PHOTOVOLTAIC (CPV) MODULES, RECEIVER AND SUB-RECEIVERS AND METHODS OF FORMING SAME

(75) Inventors: Etienne Menard, Durham, NC (US); Christopher Bower, Raleigh, NC (US); Scott Burroughs, Durham, NC (US); Joe Carr, Chapel Hill, NC (US); Bob Conner, Raleigh, NC (US); Sergiy Dets, Richmond (CA); Bruce Furman, Durham, NC (US); Matthew Meitl, Durham, NC (US); Michael Sullivan, Raleigh, NC (US)

(73) Assignee: X-Celeprint Limited, Cork (IE)

( * ) Notice: Subject to any disclaimer, the term of this patent is extended or adjusted under 35 U.S.C. 154(b) by 131 days.

(21) Appl. No.: 12/702,841

(22) Filed: Feb. 9, 2010

(65) Prior Publication Data

US 2010/0236603 A1    Sep. 23, 2010

Related U.S. Application Data

(60) Provisional application No. 61/151,073, filed on Feb. 9, 2009, provisional application No. 61/151,083, filed on
(Continued)

(51) Int. Cl.
*H01L 31/0232* (2014.01)
*H01L 31/054* (2014.01)
(Continued)

(52) U.S. Cl.
CPC ....... *G02B 19/0076* (2013.01); *G02B 3/0056* (2013.01); *G02B 19/0014* (2013.01);
(Continued)

(58) Field of Classification Search
CPC ............ H01L 31/0232; H01L 31/0522; H01L 31/0543; H01L 31/0547; Y02E 10/52;
(Continued)

(56) References Cited

U.S. PATENT DOCUMENTS 3,973,996 A    8/1976  Kennedy
4,016,586 A    4/1977  Anderson et al.
(Continued)

FOREIGN PATENT DOCUMENTS

CN    1701441 A    11/2005
CN    101286531 A    10/2008
(Continued)

OTHER PUBLICATIONS

Andreev, Viacheslav et al., "Concentrator PV Modules of "All-Glass" Design with Modified Structure", May 11-18, 2003, Paper #p-C3-72 presented at WCPEC-3, Osaka, Japan, pp. 1-4.*
(Continued)

*Primary Examiner* — Tamir Ayad
(74) *Attorney, Agent, or Firm* — William R. Haulbrook; Michael D. Schmitt; Choate, Hall & Stewart LLP

(57) ABSTRACT

CPV modules include a back plate having an array of 1 mm$^2$ or smaller solar cells thereon. A backplane interconnect network is also provided on the back plate. This backplane interconnect network operates to electrically connect the array of solar cells together. A front plate, which is spaced-apart from the back plate, is provided. This front plate includes an array of primary lenses thereon that face the array of solar cells. The front plate can be configured to provide a greater than 1000× lens-to-cell light concentration to the array of solar cells. To achieve this 1000× lens-to-cell light concentration, the primary lenses can be configured as plano-convex lenses having a lens sag of less than about 4 mm. An array of secondary optical elements may also be provided, which extend between the array of primary lenses and the array of solar cells.

26 Claims, 13 Drawing Sheets

Related U.S. Application Data on Feb. 9, 2009, provisional application No. 61/166,513, filed on Apr. 3, 2009.

(51) Int. Cl.
  *G02B 19/00* (2006.01)
  *G02B 3/00* (2006.01)

(52) U.S. Cl.
  CPC ...... *G02B 19/0042* (2013.01); *H01L 31/0232* (2013.01); *H01L 31/02325* (2013.01); *H01L 31/0543* (2014.12); *H01L 31/0547* (2014.12); *Y02E 10/52* (2013.01)

(58) Field of Classification Search
  CPC ............... G02B 3/0056; G02B 3/0076; G02B 19/0014; G02B 19/0042; G02B 19/0076
  USPC ................................. 136/246, 259
  See application file for complete search history.

(56) References Cited

U.S. PATENT DOCUMENTS

| | | | |
|---|---|---|---|
| 4,069,812 A | | 1/1978 | O'Neill |
| 4,180,414 A | | 12/1979 | Diamond et al. |
| 4,204,881 A | | 5/1980 | McGrew |
| 4,255,212 A | * | 3/1981 | Chappell et al. ............... 438/66 |
| 4,338,480 A | * | 7/1982 | Antypas et al. ............. 136/249 |
| 4,522,193 A | | 6/1985 | Bates |
| 4,711,972 A | | 12/1987 | O'Neill |
| 4,834,805 A | * | 5/1989 | Erbert ........................... 136/246 |
| 4,879,760 A | | 11/1989 | Kroll et al. |
| 4,893,612 A | * | 1/1990 | Dawson ....................... 126/689 |
| 4,956,877 A | | 9/1990 | Kroll et al. |
| 5,096,505 A | | 3/1992 | Fraas et al. |
| 5,118,361 A | | 6/1992 | Fraas et al. |
| 5,125,983 A | * | 6/1992 | Cummings ................... 136/246 |
| 5,162,935 A | | 11/1992 | Nelson |
| 5,167,724 A | | 12/1992 | Chiang |
| 5,344,497 A | | 9/1994 | Fraas et al. |
| 5,460,659 A | * | 10/1995 | Krut ............................. 136/246 |
| 5,498,297 A | | 3/1996 | O'Neill et al. |
| 5,505,789 A | | 4/1996 | Fraas et al. |
| 5,837,561 A | | 11/1998 | Kish, Jr. et al. |
| 6,031,179 A | | 2/2000 | O'Neill |
| 6,075,200 A | | 6/2000 | O'Neill |
| 6,091,017 A | | 7/2000 | Stern |
| 6,142,358 A | | 11/2000 | Cohn et al. |
| 6,162,986 A | | 12/2000 | Shiotsuka et al. |
| 6,215,060 B1 | | 4/2001 | Komori et al. |
| 6,252,155 B1 | | 6/2001 | Ortabasi |
| 6,288,324 B1 | | 9/2001 | Komori et al. |
| 6,399,874 B1 | | 6/2002 | Olah |
| 6,493,121 B1 | | 12/2002 | Althaus |
| 6,678,444 B2 | | 1/2004 | Tayebati |
| 6,717,045 B2 | | 4/2004 | Chen |
| 6,730,840 B2 | | 5/2004 | Sasaoka et al. |
| 6,804,062 B2 | | 10/2004 | Atwater et al. |
| 7,195,733 B2 | | 3/2007 | Rogers et al. |
| 7,299,632 B2 | | 11/2007 | Laing et al. |
| 7,388,146 B2 | | 6/2008 | Fraas et al. |
| 7,521,292 B2 | | 4/2009 | Rogers et al. |
| 7,557,367 B2 | | 7/2009 | Rogers et al. |
| 7,622,367 B1 | | 11/2009 | Nuzzo et al. |
| 7,638,708 B2 | | 12/2009 | Fork et al. |
| 7,638,750 B2 | | 12/2009 | Kline |
| 7,662,545 B2 | | 2/2010 | Nuzzo et al. |
| 7,704,684 B2 | | 4/2010 | Rogers et al. |
| 7,799,699 B2 | | 9/2010 | Nuzzo et al. |
| 7,932,123 B2 | | 4/2011 | Rogers et al. |
| 7,943,491 B2 | | 5/2011 | Nuzzo et al. |
| 7,972,875 B2 | * | 7/2011 | Rogers et al. ................. 438/21 |
| 8,035,027 B2 | * | 10/2011 | Moslehi ............... H01L 31/042<br>136/244 |
| 8,470,701 B2 | | 6/2013 | Rogers et al. |
| 8,558,243 B2 | | 10/2013 | Bibl et al. |
| 8,791,474 B1 | | 7/2014 | Bibl et al. |
| 8,794,501 B2 | | 8/2014 | Bibl et al. |
| 8,835,940 B2 | | 9/2014 | Hu et al. |
| 8,865,489 B2 | | 10/2014 | Rogers et al. |
| 8,974,899 B1 | | 3/2015 | Wilt |
| 8,987,765 B2 | | 3/2015 | Bibl et al. |
| 9,111,464 B2 | | 8/2015 | Bibl et al. |
| 9,139,425 B2 | | 9/2015 | Vestyck |
| 9,153,171 B2 | | 10/2015 | Sakariya et al. |
| 9,161,448 B2 | | 10/2015 | Menard et al. |
| 9,178,123 B2 | | 11/2015 | Sakariya et al. |
| 9,217,541 B2 | | 12/2015 | Bathurst et al. |
| 9,240,397 B2 | | 1/2016 | Bibl et al. |
| 9,252,375 B2 | | 2/2016 | Bibl et al. |
| 9,254,505 B2 | | 2/2016 | Connor et al. |
| 9,358,775 B2 | | 6/2016 | Bower et al. |
| 9,367,094 B2 | | 6/2016 | Bibl et al. |
| 9,412,727 B2 | | 8/2016 | Menard et al. |
| 9,478,583 B2 | | 10/2016 | Hu et al. |
| 9,484,504 B2 | | 11/2016 | Bibl et al. |
| 9,520,537 B2 | | 12/2016 | Bower et al. |
| 9,555,644 B2 | | 1/2017 | Rogers et al. |
| 9,601,356 B2 | | 3/2017 | Bower et al. |
| 9,640,715 B2 | | 5/2017 | Bower et al. |
| 9,716,082 B2 | | 7/2017 | Bower et al. |
| 9,761,754 B2 | | 9/2017 | Bower et al. |
| 9,765,934 B2 | | 9/2017 | Rogers et al. |
| 9,865,832 B2 | | 1/2018 | Bibl et al. |
| 9,929,053 B2 | | 3/2018 | Bower et al. |
| 2001/0029974 A1 | | 10/2001 | Cohen et al. |
| 2003/0015637 A1 | | 1/2003 | Liebendorfer |
| 2003/0086653 A1 | | 5/2003 | Kuhara |
| 2003/0095340 A1 | | 5/2003 | Atwater et al. |
| 2003/0141570 A1 | | 7/2003 | Chen et al. |
| 2005/0081908 A1 | | 4/2005 | Stewart |
| 2005/0150542 A1 | | 7/2005 | Madan |
| 2005/0155641 A1 | | 7/2005 | Fafard |
| 2005/0247339 A1 | | 11/2005 | Barnham et al. |
| 2006/0028156 A1 | | 2/2006 | Jungwirth |
| 2006/0033833 A1 | | 2/2006 | Hurwitz et al. |
| 2006/0048811 A1 | | 3/2006 | Krut et al. |
| 2006/0063309 A1 | | 3/2006 | Sugiyama et al. |
| 2006/0231133 A1 | * | 10/2006 | Fork et al. ..................... 136/246 |
| 2006/0246301 A1 | | 11/2006 | Stachowiak |
| 2006/0250135 A1 | | 11/2006 | Buchwald et al. |
| 2006/0283497 A1 | | 12/2006 | Hines |
| 2007/0063202 A1 | * | 3/2007 | Leib ................ H01L 27/14618<br>257/80 |
| 2007/0070531 A1 | * | 3/2007 | Lu ................................. 359/851 |
| 2007/0121113 A1 | * | 5/2007 | Cohen et al. ................. 356/432 |
| 2007/0137698 A1 | | 6/2007 | Wanlass et al. |
| 2007/0277810 A1 | | 12/2007 | Stock |
| 2008/0041441 A1 | | 2/2008 | Schwartzman |
| 2008/0041444 A1 | | 2/2008 | Bendapudi et al. |
| 2008/0057776 A1 | | 3/2008 | Cummings |
| 2008/0083450 A1 | | 4/2008 | Benoit et al. |
| 2008/0087321 A1 | | 4/2008 | Schwartzman |
| 2008/0087323 A1 | | 4/2008 | Araki et al. |
| 2008/0121269 A1 | | 5/2008 | Welser et al. |
| 2008/0142070 A1 | | 6/2008 | Lechner et al. |
| 2008/0185034 A1 | | 8/2008 | Corio |
| 2008/0190478 A1 | | 8/2008 | Lin |
| 2008/0193135 A1 | | 8/2008 | Du et al. |
| 2008/0210294 A1 | * | 9/2008 | Moslehi ................ H01L 31/042<br>136/251 |
| 2008/0230112 A1 | | 9/2008 | Barnham et al. |
| 2008/0236661 A1 | | 10/2008 | Yao et al. |
| 2008/0276983 A1 | | 11/2008 | Drake et al. |
| 2008/0283117 A1 | | 11/2008 | Tsunomura |
| 2008/0295883 A1 | | 12/2008 | Ducellier et al. |
| 2009/0065044 A1 | | 3/2009 | Kim |
| 2009/0126794 A1 | | 5/2009 | Dimroth et al. |
| 2009/0194145 A1 | | 8/2009 | Kribus et al. |
| 2009/0199890 A1 | | 8/2009 | Hering et al. |
| 2009/0199891 A1 | | 8/2009 | Hering et al. |
| 2009/0223555 A1 | | 9/2009 | Ammar |
| 2009/0250094 A1 | | 10/2009 | Robison et al. |
| 2009/0250095 A1 | | 10/2009 | Thorley et al. |

(56) References Cited

U.S. PATENT DOCUMENTS

| | | |
|---|---|---|
| 2009/0261258 A1 | 10/2009 | Harris et al. |
| 2009/0261802 A1 | 10/2009 | Askins et al. |
| 2009/0266395 A1 | 10/2009 | Murthy et al. |
| 2009/0272420 A1 | 11/2009 | Kare |
| 2009/0272427 A1 | 11/2009 | Bett et al. |
| 2009/0277493 A1 | 11/2009 | Merkle |
| 2009/0298218 A1 | 12/2009 | Federici et al. |
| 2009/0308432 A1 | 12/2009 | Meyers |
| 2010/0012171 A1 | 1/2010 | Ammar |
| 2010/0014854 A1 | 1/2010 | Healey et al. |
| 2010/0018420 A1 | 1/2010 | Menard |
| 2010/0034234 A1 | 2/2010 | Hata et al. |
| 2010/0065120 A1 | 3/2010 | McDonald |
| 2010/0132756 A1 | 6/2010 | Tonooka et al. |
| 2010/0148293 A1 | 6/2010 | Jain et al. |
| 2010/0282288 A1 | 11/2010 | Cornfeld |
| 2010/0306993 A1 | 12/2010 | Mayyas et al. |
| 2010/0313954 A1 | 12/2010 | Seel et al. |
| 2010/0319773 A1 | 12/2010 | West et al. |
| 2011/0011445 A1 | 1/2011 | Spencer et al. |
| 2011/0030762 A1 | 2/2011 | Kim |
| 2011/0048535 A1 | 3/2011 | Nagyvary et al. |
| 2011/0061717 A1 | 3/2011 | Kwon et al. |
| 2011/0135955 A1 | 6/2011 | Maschwitz et al. |
| 2011/0139225 A1 | 6/2011 | Boydell |
| 2011/0155230 A1 | 6/2011 | Tsai et al. |
| 2011/0174366 A1 | 7/2011 | Frolov et al. |
| 2011/0266561 A1 | 11/2011 | Rogers et al. |
| 2011/0277815 A1 | 11/2011 | Sankrithi |
| 2012/0111390 A1 | 5/2012 | Dai |
| 2012/0128371 A1 | 5/2012 | Einicke et al. |
| 2013/0034357 A1 | 2/2013 | Lim |
| 2013/0146120 A1 | 6/2013 | Seel et al. |
| 2013/0153934 A1 | 6/2013 | Meitl et al. |
| 2013/0285477 A1 | 10/2013 | Lo et al. |
| 2013/0316487 A1 | 11/2013 | de Graff et al. |
| 2014/0076387 A1 | 3/2014 | King et al. |
| 2014/0084482 A1 | 3/2014 | Hu et al. |
| 2014/0090687 A1 | 4/2014 | Den Boer et al. |
| 2014/0159043 A1 | 6/2014 | Sakariya et al. |
| 2014/0159065 A1 | 6/2014 | Hu et al. |
| 2014/0159066 A1 | 6/2014 | Hu et al. |
| 2014/0261627 A1 | 9/2014 | Meitl et al. |
| 2014/0261628 A1 | 9/2014 | Meitl et al. |
| 2015/0028362 A1 | 1/2015 | Chan et al. |
| 2015/0219975 A1 | 8/2015 | Phillips et al. |
| 2015/0221803 A1 | 8/2015 | Suarez Arias |
| 2015/0263066 A1 | 9/2015 | Hu et al. |
| 2015/0295114 A1 | 10/2015 | Meitl et al. |
| 2016/0093600 A1 | 3/2016 | Bower et al. |
| 2016/0308103 A1 | 10/2016 | Hu et al. |
| 2017/0018675 A1 | 1/2017 | Meitl et al. |
| 2017/0019180 A1 | 1/2017 | Lucrecio et al. |
| 2017/0047462 A1 | 2/2017 | Ishigaki |
| 2017/0093501 A1 | 3/2017 | Meitl et al. |
| 2017/0338374 A1 | 11/2017 | Zou et al. |

FOREIGN PATENT DOCUMENTS

| | | |
|---|---|---|
| CN | 102110595 A | 6/2011 |
| CN | 202217686 U | 5/2012 |
| CN | 102944576 A | 2/2013 |
| DE | 10 2008 017 370 A1 | 8/2009 |
| EP | 0 657 948 A2 | 6/1995 |
| EP | 1 835 547 A1 | 9/2007 |
| EP | 1-956-662 A2 | 8/2008 |
| EP | 3001586 A1 | 3/2016 |
| GB | 1-529-409 A | 10/1978 |
| JP | H1 051020 A | 2/1998 |
| WO | WO-82/04500 A1 | 12/1982 |
| WO | WO-91/18419 A1 | 11/1991 |
| WO | WO-02/025842 A2 | 3/2002 |
| WO | WO 03/019617 A2 | 3/2003 |
| WO | WO 2006/128417 A1 | 12/2006 |
| WO | WO 2008/117297 A2 | 10/2008 |
| WO | WO-2008/143635 A1 | 11/2008 |
| WO | WO 2009/008996 A2 | 1/2009 |
| WO | WO-2009/061493 A1 | 5/2009 |
| WO | WO-2010/091391 A2 | 8/2010 |
| WO | WO-2011/156344 A2 | 12/2011 |
| WO | WO-2012/115603 A1 | 8/2012 |
| WO | WO-2014/096200 A1 | 6/2014 |
| WO | WO-2014/142650 A1 | 9/2014 |
| WO | WO-2017/105581 A2 | 6/2017 |

OTHER PUBLICATIONS

He, Miao et al., "Reflowed solgel spherical microlens for high-efficiency optical coupling between a laser diode and a single-mode fiber", Mar. 10, 2005, Applied Optics, vol. 44, No. 8, pp. 1469-1473.*

Thorlabs Specification Sheet for LA5458—Plano-convex Lens, Copyright 1999-2012 Thorlabs.*

Invitation to Pay Additional Fees and, Where Applicable, Protest Fee Corresponding to International Application No. PCT/US2010/023577; Date of Mailing: May 16, 2011:7 Pages.

International Search Report Corresponding to International Application No. PCT/US2010/023577; Date of Mailing: Aug. 4, 2011; 19 pages.

International Preliminary Report on Patentability Corresponding to International Application No. PCT/US2010/023577; Date of Issuance: Aug. 25, 2011; 14 pages.

Examination Search Report Corresponding to United Arab Emirates Patent Application No. UAE/P/0792/2011; dated Oct. 28, 2016, 19 Pages.

Baranov et al., Semiconductor Lasers: Fundamentals and Applications, Woodhead Publishing Limited, 33:319-319, (2013).

Bub, R. et al., Optical Signal and Energy Transmission for Implantable Intraocular Microsystems, 5 pages, 2006.

Derkacs, D. et al., Lattice-matched multijunction solar cells employing a 1 eV GaInNAsSb bottom cell, Journal of Photonics for Energy, 2:021805 (2012).

Friedman, D. J. et al., Analysis of Multijunction Solar Cell Current-Voltage Characteristics in the Presence of Luminescent Coupling, IEEE J. Photovoltaics, 3(4):1429-1436 (2013).

Friedman, D. J. et al., Effect of Luminescent Coupling on the Optimal Design of Multijunction Solar Cells, IEEE J. Photovoltaics, 4(3):986-990 (2014).

Geisz, J. F. et al., High-efficiency GaInP/GaAs/InGaAs triple-junction solar cells grown inverted with a metamorphic bottom junction, Applied Physics Letters, 91(2):023502 (2007).

Gelest Inc., Silicone Fluids, <http://www.gelest.com/goods/pdf/siliconefluids.pdf%3B> 1998; pp. 1.

Gupta, S.C., Optoelectronic Devices and Systems, PHI Learning Pvt. Ltd., pp. 126-130, (2014).

Helmers, Henning, PV-Cells for Optical Power Transmission, Franhofer Institute for Solar Energy Systems, Mar. 2014, From URLS: https://www.ise.fraunhofer.de/de/veroeffentlichungen/veroeffentlichungen-pdf-dateien/infomaterial/broschueren-und-produktinformationen/geschaeftsfelder/flyer-pv-cells-for-optical-power-transmission.pdf (2pages).

Jeong, W-S. et al., Evaluation of external quantum efficiency of a 12.35% tandem solar cell comprising dye-sensitized and CIGS solar cells, Solar Energy Materials & Solar Cells, 95:3419-3423 (2011).

Keiser, Gerd, Optical Communications Essentials, McGraw-Hill, pp. 87-89 and 107-112, (2003).

Kim, D. et al., Fabrication of rough Al doped ZnO films deposited by low pressure chemical vapor deposition for high efficiency thin film solar cells, Current Applied Physics, 10:S459-S462 (2010).

Kim, D. et al., High Efficiency Silicon and Germanium Stack Junction Solar Cells, 2012 IEEE International Electron Devices Meeting (IEDM), Dec. 10-13, 2012, pp. 12.6.1-12.6.4.

Kurtz, S. et al., A Comparison of Theoretical Efficiencies of Multi-junction Concentrator Solar Cells, Progress in Photovoltaics: research and applications, 16(6):537-546 (2008).

Lentine et al., Optimal Cell Connections for Improved Shading, Reliability, and Spectral Performance of Microsystem Enabled Photovoltaic (MEPV) Modules, IEEE, pp. 3048-3054, (2010).

(56) References Cited

OTHER PUBLICATIONS

Manasreh, M.O., Strained-Layer Quantum Wells and Their Applications, Gordon and Breach Science Publishers, pp. 529-532 (1997).
Marti, A. et al., Limiting efficiencies for photovoltaic energy conversion in multigap systems, Solar Energy Materials and Solar Cells, 43(2):203-222 (1996).
RP Photonics Encyclopedia, Photodiodes, 6 pages, Dec. 2014, <http://www.rp-photonics.com/photodiode>.
Steiner, M. A. et al., Experimental and modeling analysis of internal luminescence in III-V solar cells, 57-61 (2013).
Steiner, M. A. et al., Non-linear luminescent coupling in series-connected multijunction solar cells, Applied Physics Letters, 100(25):251106-1-251106-5 (2012).
Steiner, M. et al., Measuring IV curves and subcell photocurrents in the presence of luminescent coupling, IEEE Journal of Photovoltaics, 3(2):879-887 (2013).
Sun, G. et al., High efficiency thin-film crystalline Si/Ge tandem solar cell, Optics Express, vol. 18, Issue 4, pp. 3746-3753 (2010), https://doi.org/10.1364/OE.18.003746.
Trindade, A.J. et al., Precision transfer printing of ultra-thin AlInGaN micron-size light-emitting diodes, Crown, pp. 217-218, (2012).
Zappe, Hans, Laser Diode Microsystems, Springer-Verlag Berlin Heidelberg, pp. 144-149, 162-163, 277-278, (2004).
Bower, C. A. et al., Micro-Transfer-Printing: Heterogeneous Integration of Microscale Semiconductor Devises using Elastomer Stamps, IEEE Conference, (2014).
Bower, C. A. et al., Transfer Printing: An Approach for Massively Parallel Assembly of Microscale Devices, IEEE, Electronic Components and Technology Conference, (2008).
Brown, A. S. et al., Radiative coupling as a means to reduce spectral mismatch in monolithic tandem solar cell stacks theoretical considerations, Conference Record of the Twenty-Ninth IEEE Photovoltaic Specialists Conference, pp. 868-871, (2002).
Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341 (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
King, D. L. et al., New methods for measuring performance of monolithic multi-junction solar cells, IEEEE Photovoltaic Specialists Conference, Conference Record of the Twenty-Eighth, pp. 1197-1201, (2000).
Li, G. et al., CN-202217686-U, Low concentration photovoltaic generating module, 11 pages, (2012) English Machine Translation.
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Schubert, J. et al., High-voltage GaAs photovoltaic laser power converters, IEEE Transactions on Electron Devices 56(2):170-175, (2009).
Yoon, J. et al, GaAs photovoltaics and optoelectronics using releasable multilayer epitaxial assemblies, Nature, 465:329-334, (2010).

\* cited by examiner

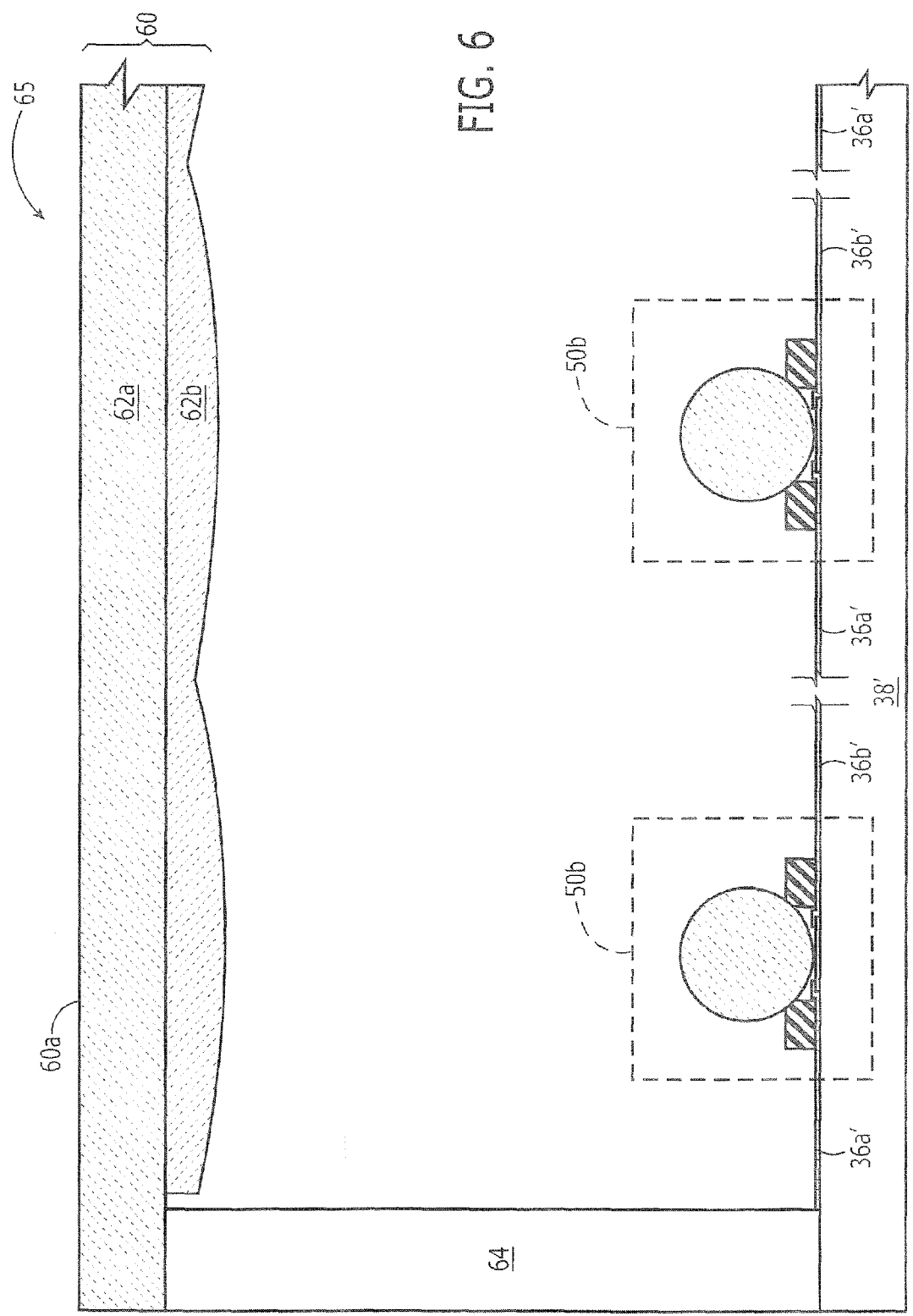

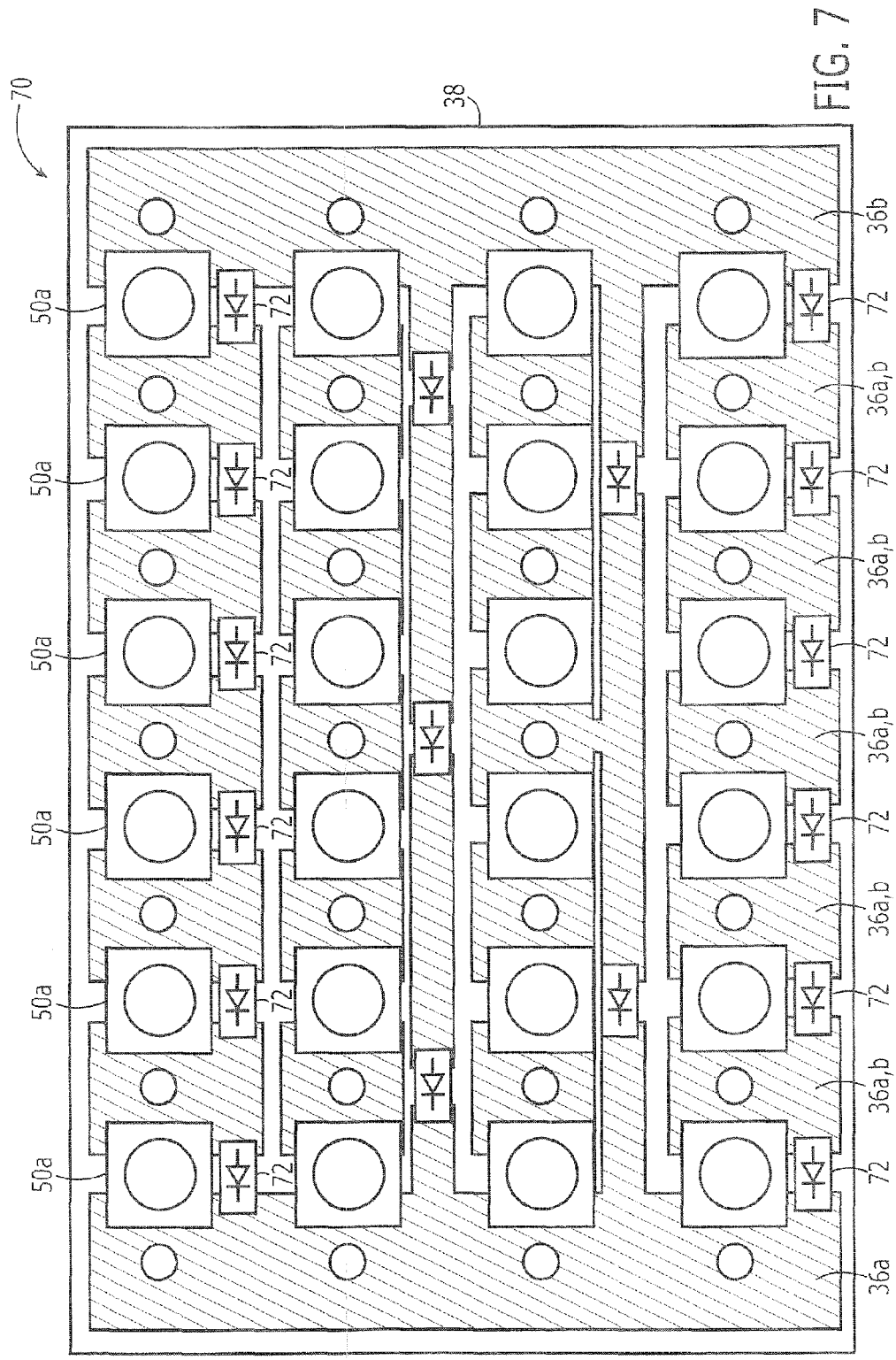

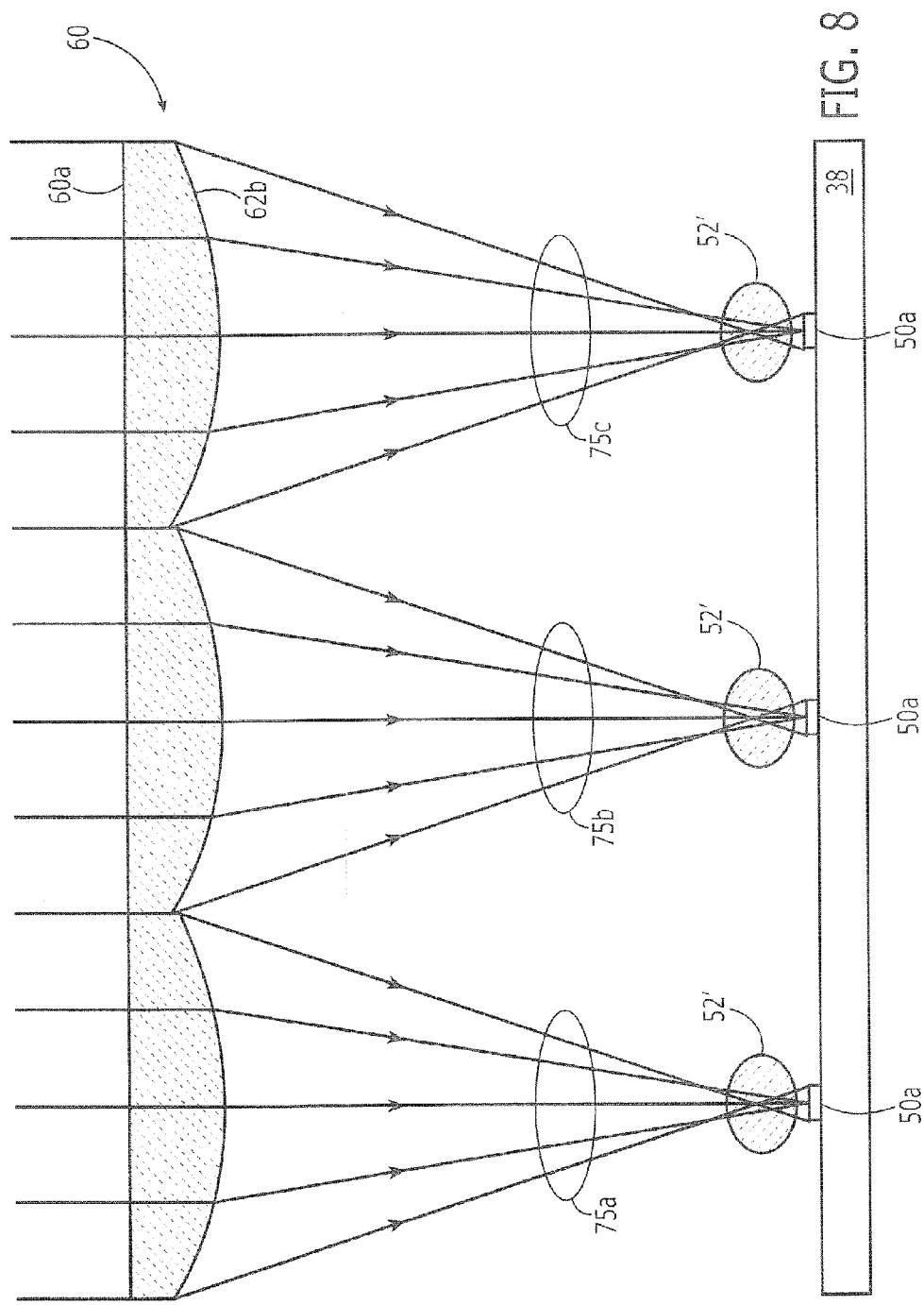

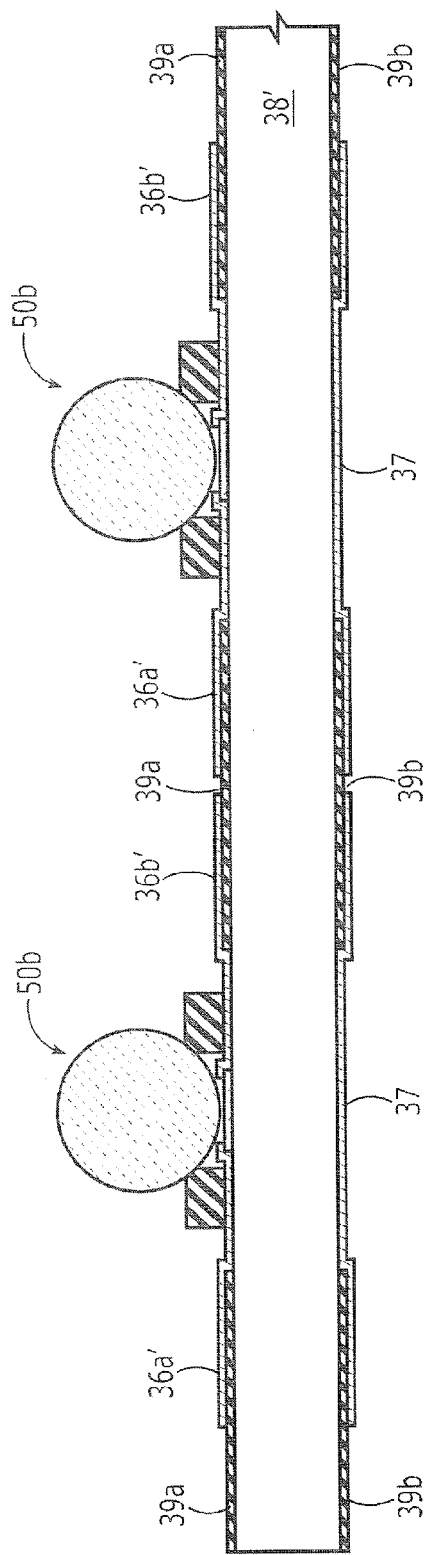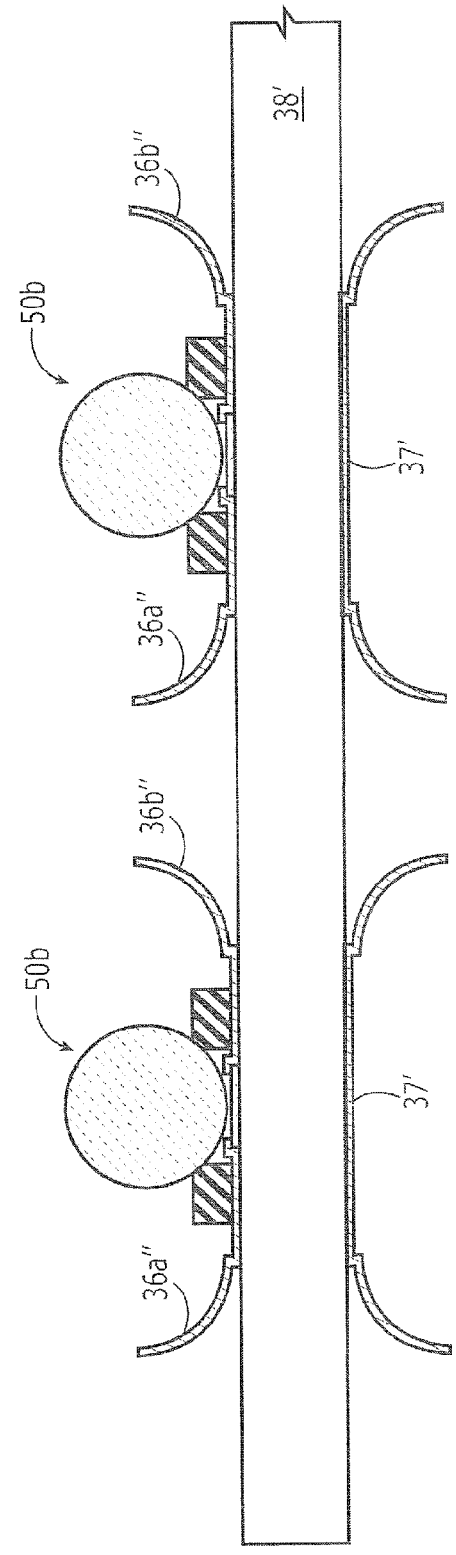

CONCENTRATOR-TYPE PHOTOVOLTAIC (CPV) MODULES, RECEIVER AND SUB-RECEIVERS AND METHODS OF FORMING SAME

REFERENCE TO PRIORITY APPLICATIONS

This application claims priority to U.S. Provisional Application Ser. Nos. 61/151,073, filed Feb. 9, 2009; 61/151,083, filed Feb. 9, 2009; and 61/166,513, filed Apr. 3, 2009, the disclosures of which are hereby incorporated herein by reference.

STATEMENT REGARDING FEDERALLY SPONSORED RESEARCH OR DEVELOPMENT

This invention was made with Government Support under contract/grant DE-FG36-08GO18021 awarded by the United States Department of Energy. The Government has certain rights in the invention.

CROSS-REFERENCE TO RELATED APPLICATIONS

This application is related to U.S. application Ser. No. 11/421,654, filed Jun. 1, 2006; Ser. No. 11/423,192, filed Jun. 9, 2006; Ser. No. 11/423,287, filed Jun. 9, 2006; Ser. No. 11/851,182, filed Sep. 6, 2007; Ser. No. 12/405,475, filed Mar. 17, 2009; and Ser. No. 12/564,566, filed Sep. 22, 2009, the disclosures of which are hereby incorporated by reference.

FIELD OF THE INVENTION

The present invention relates to integrated circuit devices and methods of forming same and, more particularly, to photovoltaic devices and methods of forming same.

BACKGROUND OF THE INVENTION

Concentrated photovoltaic (CPV) systems concentrate sunlight onto photovoltaic surfaces for the purposes of electrical power generation. CPV systems are often mounted on solar trackers to keep the focal point of light on the photovoltaic surfaces as the sun moves across the sky. An early example of a CPV system utilized acrylic Fresnel lenses to focus light on water-cooled silicon solar cells and two axis solar tracking. Other examples of CPV systems utilized hybrid silicone-glass Fresnel lenses and passive heat sinks for solar cell cooling.

Semiconductor properties allow solar cells to operate more efficiently in concentrated light systems, as long as the cell junction temperature is kept sufficiently cool using suitable heat sinks. CPV systems operate most effectively in direct sunlight because diffuse light caused by cloudy conditions typically cannot be efficiently concentrated.

CPV systems offer advantages over conventional flat panel solar cells because CPV solar collectors are typically less expensive than an equivalent area of solar cells. CPV system hardware (solar collector and tracker) is targeted to be priced well under $3/Watt, whereas silicon flat panels are commonly sold at $3-$5/Watt.

Low concentration CPV systems typically have solar concentration levels of 2-100 suns. For economic reasons, conventional or modified silicon solar cells are typically used and, at these concentrations, the heat flux is low enough that the cells typically do not need to be actively cooled. The laws of optics dictate that a solar collector with a low concentration ratio can have a high acceptance angle. Accordingly, low concentration CPV systems typically do not require active solar tracking. Medium concentration CPV systems, which typically have solar concentration levels of 100 to 300 suns, require solar tracking and cooling. High concentration photovoltaic (HCPV) systems employ concentrating optics consisting of dish reflectors or fresnel lenses that concentrate sunlight to intensities of 300 suns or more. The solar cells in these HCPV systems typically require high-capacity heat sinks to prevent thermal destruction and to manage temperature related performance losses. Multijunction solar cells are currently favored over silicon solar cells as they are typically more efficient. Although the cost of multijunction solar cells can be 100× that of comparable silicon cells, the cell cost is typically only a small fraction of an cost of the overall CPV system, which means that system economics can often favor the use of multijunction cells.

SUMMARY OF THE INVENTION

Methods of forming concentrator-type photovoltaic (CPV) receivers according to some embodiments of the invention include forming a solar cell and a self-centering lens support on a substrate. The self-centering lens support is preferably formed to have an opening therein that exposes a light receiving surface of the solar cell. A spherical lens is also formed on the self-centering lens support, opposite the light receiving surface of the solar cell. According to some of these embodiments of the invention, the spherical lens is sealed to the opening in the self-centering lens support. Preferably, the seal is a hermetic seal. The sealing operation may include annealing the spherical lens and the self-centering lens support at a temperature in a range from about 150° C. to about 350° C. This annealing of the lens and lens support may be performed in a chemically inert ambient. Examples of chemically inert ambients include nitrogen and/or argon ambients, which may be free of oxygen.

According to additional embodiments of the invention, the step of forming the self-centering lens support is preceded by a step of forming a pair of electrical interconnects on the light receiving surface of the solar cell. The step of forming the self-centering lens support may then include depositing the self-centering lens support onto the pair of electrical interconnects. This self-centering lens support may be ring-shaped. According to still further embodiments of the invention, the step of forming a spherical lens on the self-centering lens support may be preceded by forming a ring-shaped sealing structure, which surrounds the self-centering lens support, on the substrate. A diameter of the ring-shaped sealing structure can be greater than a diameter of the self-centering lens support. This ring-shaped sealing structure is typically concentrically arranged relative to the self-centering lens support. Based on these embodiments of the invention, a concentrator-type photovoltaic (CPV) receiver may include a solar cell and a self-centering ring-shaped lens support having an opening therein, which exposes a light receiving surface of the, on the substrate. A lens, which is provided on the self-centering lens support, extends opposite the light receiving surface.

A concentrator-type photovoltaic (CPV) module according to additional embodiments of the invention may include a back plate having an array of 1 $mm^2$ or smaller solar cells thereon. These cells may have thicknesses of less than about 20 µm. A backplane interconnect network is also provided on the back plate. This backplane interconnect network operates to electrically connect the array of solar cells together. A front plate, which is spaced-apart from the back plate, is also provided. This front plate includes an array of primary lenses thereon that face the array of solar cells. In particular, the front plate is configured to provide a greater than 1000× lens-to-cell light concentration to the array of solar cells. To achieve this 1000× lens-to-cell light concentration, the primary lenses can be configured as plano-convex lenses having a lens sag of less than about 4 mm. In particular, the lenses can be configured to have a lens sag defined by the following relationship:

$$\text{sag}=f(n-1)-((f(n-1))^2-(\tfrac{1}{2}d)^2)^{1/2},$$

where f is the focal length of the lenses, n is refractive index of the lenses and d is the diameter of the lenses.

According to still further embodiments of the present invention, an array of secondary optical elements may be provided, which extend between the array of primary lenses and the array of solar cells. Each of the secondary optical elements is mounted proximate a light receiving surface of a corresponding solar cell. In particular, each of the secondary optical elements may be configured to have a center-of-mass in substantial alignment with a center of the receiving surfaces of a corresponding solar cell. These secondary optical elements may be spherical lenses having a diameter of less than about 5 mm. According to additional embodiments of the invention, a size, shape, composition and location of the secondary optical elements relative to the array of solar cells are sufficient, in combination, to increase an acceptance angle of the CPV module relative to an otherwise equivalent module that lacks the array of secondary optical elements.

Additional embodiments of the invention include concentrator-type photovoltaic (CPV) modules. These modules include a front plate having an array of primary lenses thereon and a back plate having an array of solar cells thereon that face the array of primary lenses. An array of secondary optical elements is also provided, which extends between the array of primary lenses and the array of solar cells. A backplane is also provided. This backplane, which electrically connects the array of solar cells together, extends between the back plate and the array of solar cells. According to some embodiments of the invention, the backplane includes first and second interconnect networks that are electrically connected to first and second terminals of the array of solar cells, respectively. A plurality of over-voltage protection diodes are also provided. These diodes have cathode terminals electrically connected to the first interconnect network and anode terminals electrically connected to the second interconnect network.

The front plate has a first light receiving surface thereon. Each of a plurality of the primary lenses is configured to concentrate light received at the first surface of the front plate to a corresponding optical element in the array of secondary optical elements. Moreover, each of a plurality of the secondary optical elements may be further configured to concentrate light received from the array of primary lenses to a light receiving surface of a corresponding solar cell in the array of solar cells. A frame may also be mounted to the back plate. This frame is configured to support the front plate opposite the array of solar cells. According to additional embodiments of the invention, the front plate and the array of primary lenses may be configured as a contiguous piece or composite of optically transparent material. For example, the array of primary lenses may be laminated or molded onto an interior surface of the front plate. The primary lenses may be plano-convex lenses.

According to still further embodiments of the invention, the backplane interconnect network includes at least one metal layer. For example, the backplane interconnect network may include a copper layer having a thickness in a range from about 10 μm to about 50 μm. Moreover, the backplane interconnect network may include a first partially-released metal layer on a primary surface of the back plate. This first partially-released metal layer can be configured to operate as a heat sink for the array of solar cells. A second partially-released metal layer may also be provided on a secondary surface of the back plate, which extends opposite the primary surface of the back plate. This second partially-released metal layer may operate as a heat sink for the back plate. According to still further embodiments of the invention, each of the plurality of secondary optical elements may have a convex surface facing a respective one of the plurality of the primary lenses and a convex surface facing an underlying solar cell in the array of solar cells.

Methods of forming a concentrator-type photovoltaic (CPV) modules according to still further embodiments of the invention include forming a front plate having an array of primary lenses thereon and forming a back plate having an array of solar cells thereon that face the array of primary lenses. An array of secondary optical elements is also formed to extend between the array of primary lenses and the array of solar cells. A backplane interconnect network, which electrically connects the array of solar cells together, is formed to extend between the back plate and the array of solar cells.

According to some of these embodiments of the invention, the step of forming a backplane interconnect network includes depositing a metal layer on a primary surface of the back plate and then patterning the metal layer into a first backplane, which is electrically connected to first terminals of the solar cells, and a second backplane, which is electrically connected to second terminals of the solar cells. In some of these embodiments of the invention, the step of depositing the metal layer on the primary surface may be preceded by forming an electrically insulating release layer on the primary surface. The step of patterning the metal layer may also be followed by a step of selectively removing portions of the electrically insulating release layer extending between the first backplane and the primary surface of the back plate.

A photovoltaic device according to an additional embodiment of the invention includes a first substrate of a first material having at least a first electrically conductive via therein that extends between first and second opposing surfaces of the first substrate. A second substrate of a second material different from the first material is provided on the first substrate. The second substrate includes a solar cell, which has a light receiving surface thereon, and first and second terminals, which are electrically connected to first and second regions in the solar cell. A first electrically conductive film is provided on the light receiving surface. The first electrically conductive film extends from the first terminal of the solar cell to the first electrically conductive via and onto the first surface of the first substrate. This solar cell may be a compound semiconductor solar cell and the first and second regions in the solar cell may be semiconductor regions of opposite conductivity type. A second electrically conductive via may also extend between first and second opposing surfaces of the first substrate and a second electrically conductive film may be provided that extends from the second terminal of the solar cell to the second electrically conductive via.

A photovoltaic device according to still further embodiments of the invention includes a first substrate of a first material having at least a first electrically conductive structure thereon extending between first and second opposing surfaces of the first substrate. A second substrate of a second material different from the first material is provided on the first substrate. The second substrate includes a solar cell having a light receiving surface thereon and first and second terminals electrically connected to first and second regions in the solar cell. A first electrically conductive film is provided on the light receiving surface. The first electrically conductive film extends from the first terminal of the solar cell to the first electrically conductive structure.

BRIEF DESCRIPTION OF THE DRAWINGS

FIG. 6 is a cross-sectional view of a portion of a CPV module, according to an embodiment of the invention.

FIG. 7 is a plan view of a two-dimensional array of CPV sub-receivers mounted on an underlying backplane interconnect network, according to an embodiment of the invention.

FIG. 8 is a generalized cross-sectional view of a CPV module having primary and secondary lens elements therein, according to an embodiment of the invention.

FIGS. 9a-9b illustrate methods of forming a backplane interconnect network with self-release heat sink elements, according to an embodiment of the present invention.

DESCRIPTION OF PREFERRED EMBODIMENTS

Figure 1A:
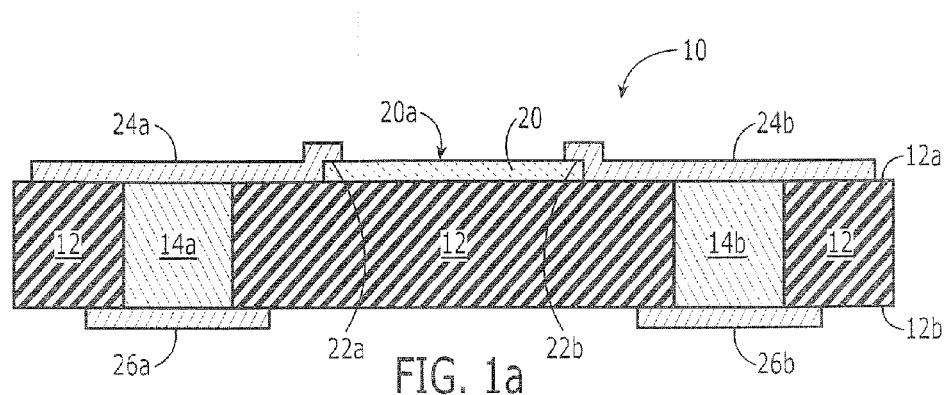
FIGS. 1a-1c are cross-sectional views that illustrate concentrated photovoltaic (CPV) sub-receivers and receivers according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
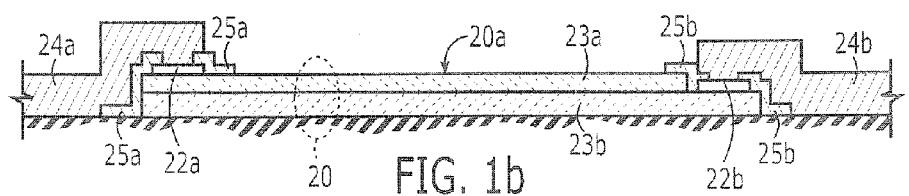

FIGS. 1a-1b illustrate a photovoltaic device 10 according to an embodiment of the present invention. This photovoltaic device 10 includes a first substrate 12 of a first material having a first electrically conductive via 14a extending therein. This first electrically conductive via 14a extends between first and second opposing surfaces 12a, 12b of the first substrate 12. The first and second opposing surfaces 12a, 12b may be top and bottom surfaces, respectively. A second substrate 20 of a second material different from the first material is provided on the first substrate 12. The first substrate 12 and the second substrate 20 preferably comprise materials having substantially matched thermal coefficients of expansion (TCE). Typical materials that may be used for the first substrate 12 include, but are not limited to, alumina, aluminum nitride, silicon and beryllium oxide.

The second substrate 20 includes a solar cell, which has a light receiving surface 20a thereon, and first and second electrically conductive terminals 22a, 22b. These first and second terminals 22a, 22b are electrically connected to first and second regions 23a, 23b in the solar cell, respectively. A first electrically conductive film 24a is provided on the light receiving surface 20a. The first electrically conductive film 24a extends onto the first surface 12a of the first substrate 12 and electrically connects the first terminal 22a of the solar cell to the first electrically conductive via 14a. This electrical contact to the first terminal 22a may be provided within an opening in a patterned electrically insulating layer 25a, which may further operate as an anti-reflective coating. The solar cell may be a multi-junction solar cell containing compound semiconductor layers therein and the first and second regions 23a, 23b may be semiconductor regions of opposite conductivity type (e.g., N-type, P-type). A second electrically conductive via 14b may also extend between the first and second opposing surfaces 12a, 12b of the first substrate 12 and a second electrically conductive film 24b may be provided that extends from the second terminal 22b of the solar cell to the second electrically conductive via 14b. An electrical contact between the second terminal 22b and the second electrically conductive film 24b may be provided within an opening in a patterned electrically insulating layer 25b. First and second output pads 26a, 26b are also provided adjacent the second surface 12b of the first substrate 12. As illustrated, the first and second output pads 26a, 26b are electrically connected to the first and second electrically conductive vias 14a, 14b, respectively. These first and second output pads 26a, 26b provide a means for electrically connecting terminals of the solar cell (e.g., anode and cathode terminals) within the second substrate 20 to an underlying receiver board (e.g., backplane).

These first and second output pads 26a, 26b enable the photovoltaic device 10 to operate as a concentrated photovoltaic (CPV) sub-receiver that can be electrically connected to an underlying receiver substrate. This configuration of the CPV sub-receiver enables higher CPV receiver performance, higher precision, increased reliability, enhanced scalability and reduced cost, among other benefits. Moreover, the photovoltaic device 10 of FIGS. 1a-1b allows the use of high-precision, high-throughput manufacturing processes including photolithography, screen printing, laser drilling and self-aligning surface mount assemblies to fabricate receivers that are suitable for use with small (<1 mm) solar cells, including CPV systems that use thin solar cells. These cells may have thicknesses of less than 20 um, or possibly less than 12 um or even less than 8 um. These embodiments also enable CPV systems that advantageously use transfer printed solar cells, such as those that are physically released from a growth substrate and retrieved and printed using stamps. Examples of transfer printed solar cells are described in U.S. Pat. No. 7,622,367 to Nuzzo et al., entitled "Methods and Devices for Fabricating and Assembling Printable Semiconductor Elements," the disclosure of which is hereby incorporated herein by reference.

As described more fully hereinbelow, embodiments of the invention provide sub-receivers for CPV applications that may be produced and assembled into modules in a cost effective manner and that may be easily scaled to high volume production; provide a sub-receiver for CPV that is suitable for use with small (<1 mm) and/or thin (<20 um) solar cells; provide a sub-receiver for CPV that may be assembled with good positional accuracy; and provide a sub-receiver for CPV that includes means for the transfer of electric energy from a solar cell without damaging the solar cell. Accordingly, embodiments of the invention described herein provide sub-receivers for CPV that do not have to incorporate wires, ribbons, cables, or leads. Instead, these embodiments provide a sub-receiver for CPV that includes means for the transfer of electric energy through thin-film and thick-films, conductive vias, and/or side-positioned vertical interconnects. These embodiments of the invention further provide sub-receivers for CPV that may be tested rapidly, in a parallel manner, prior to binning, sorting, and final assembly.

Figure 1C:
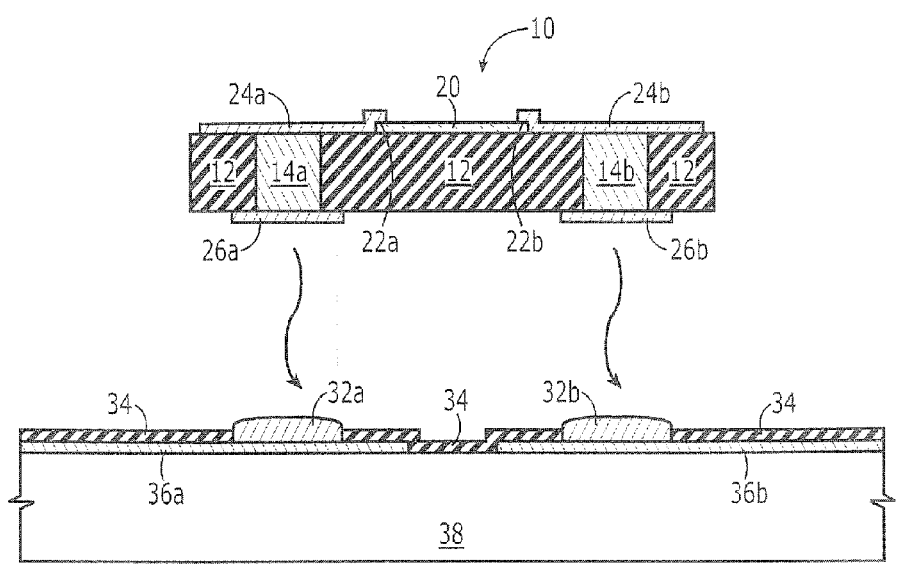

Accordingly, as illustrated by FIG. 1c, the photovoltaic device 10 of FIG. 1a may be electrically and mechanically bonded to an underlying receiver substrate 38 having patterned first and second electrically conductive patterns 36a, 36b (e.g., thick film interconnects) thereon. An electrically insulating passivation layer 34 is provided on the first and second electrically conductive patterns 36a, 36b, as illustrated. This passivation layer 34 is patterned to define openings therein that expose the electrically conductive patterns 36a, 36b. First and second electrically conductive solder pads 32a, 32b are provided on the electrically conductive patterns, 36a, 36b, using conventional techniques such as electroplating. These solder pads 32a, 32b may be electrically and mechanically bonded to the first and second output pads 26a, 26b, respectively, to thereby define a mounted sub-receiver. This mounted sub-receiver may be one of any array of interconnected sub-receivers that operate as a relatively high current photovoltaic device/module, as described more fully hereinbelow.

Figure 2:
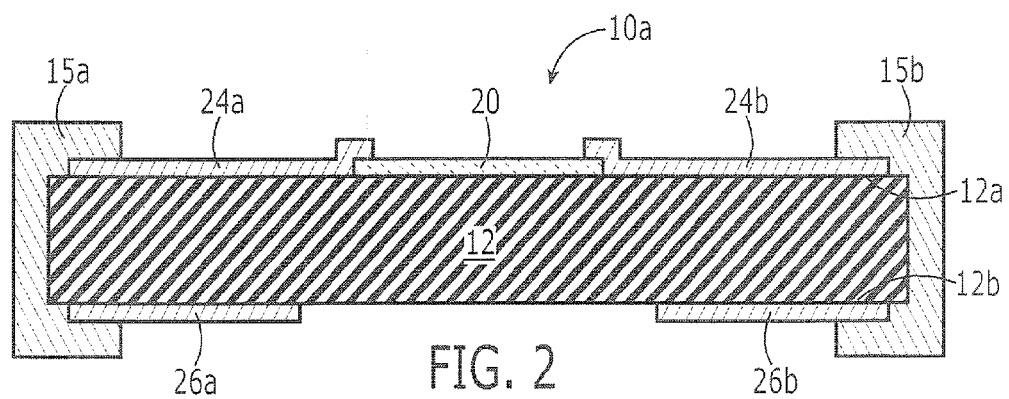
FIG. 2 is a cross-sectional view of a CPV sub-receiver according to an embodiment of the invention.

FIG. 2 illustrates a photovoltaic device 10a according to a further embodiment of the present invention. This photovoltaic device 10a, which may operate as a sub-receiver within a CPV system, is similar to the device 10 of FIGS. 1a-1b. However, as shown by FIG. 2, the device 10a utilizes first and second electrically conductive structures 15a, 15a on outer sidewall surfaces of the first substrate 12. As illustrated, these electrically conductive structures 15a, 15b extend in a wrap-around manner between first and second opposing surfaces 12a, 12b of the first substrate 12. These structures 15a, 15b replace the electrically conductive vias 14a, 14b illustrated by FIGS. 1a-1b.

Figure 3A:
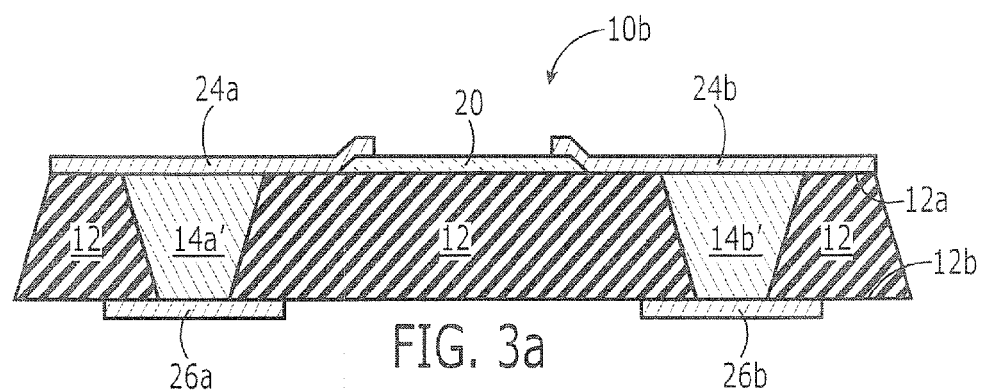
FIG. 3a-3c are cross-sectional views of CPV sub-receivers according to embodiments of the invention.
Figure 3B:
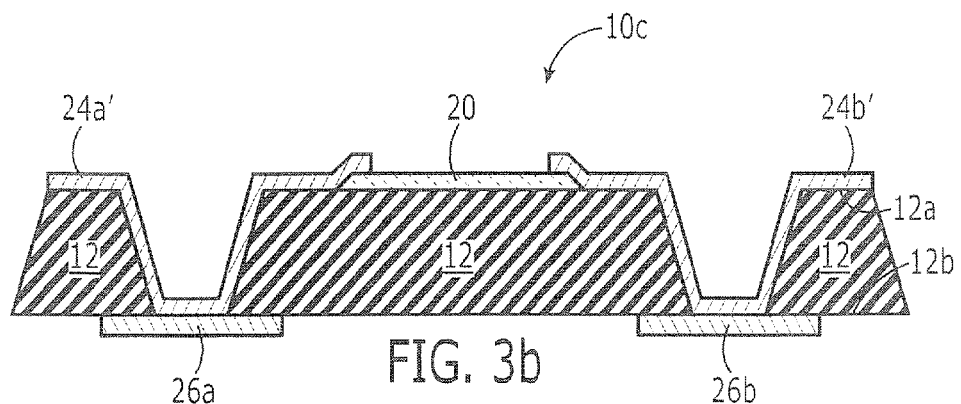
Figure 3C:
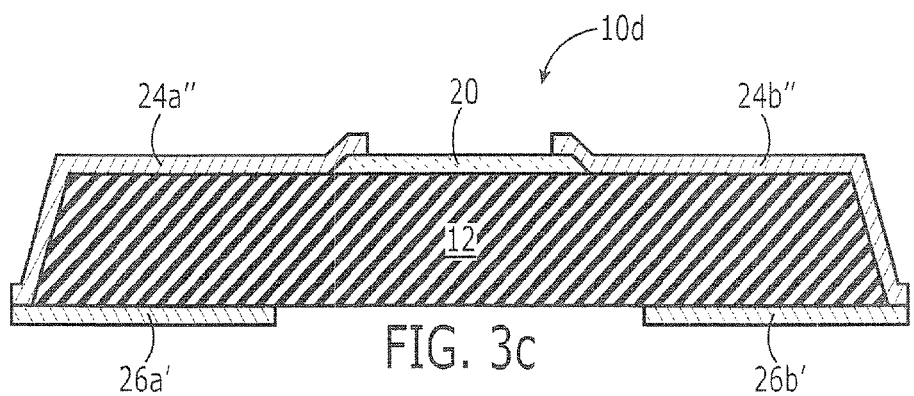

FIGS. 3a-3c illustrate photovoltaic devices 10b-10d according to still further embodiments of the invention. The photovoltaic device 10b of FIG. 3a is similar to the device 10 of FIGS. 1a-1b, however, the electrically conductive vias 14a, 14a of FIG. 1a are replaced with vias 14a', 14b' having sloped sidewalls. The sloped sidewalls of the electrically conductive vias 14a', 14b' may yield high reliability electrical interconnects that support vertical currents between the first and second electrically conductive films 24a, 24b and the first and second output pads 26a, 26b. The photovoltaic device 10c of FIG. 3b is similar to the photovoltaic device 10b of FIG. 3a, however, the electrically conductive vias 14a, 14b are omitted. Instead, through-substrate trenches 27a, 27b, which have sloped sidewalls, are formed in the first substrate 12 and then lined with first and second electrically conductive layers 24a', 24b' that extend directly between respective first and second terminals 22a, 22b and the first and second output pads, 26a, 26b. The photovoltaic device 10d of FIG. 3c is similar to the photovoltaic device 10a of FIG. 2, however, the electrically conductive structures 15a, 15b of FIG. 2 are replaced by first and second electrically conductive layers 24a", 24b", which extend directly on opposing sidewalls of the first substrate 12. In addition, first and second output pads 26a', 26b' are provided directly on the second surface 12b of the first substrate 12 and on outside edges of the first and second electrically conductive layers 24a", 24b", as illustrated.

Figure 4:
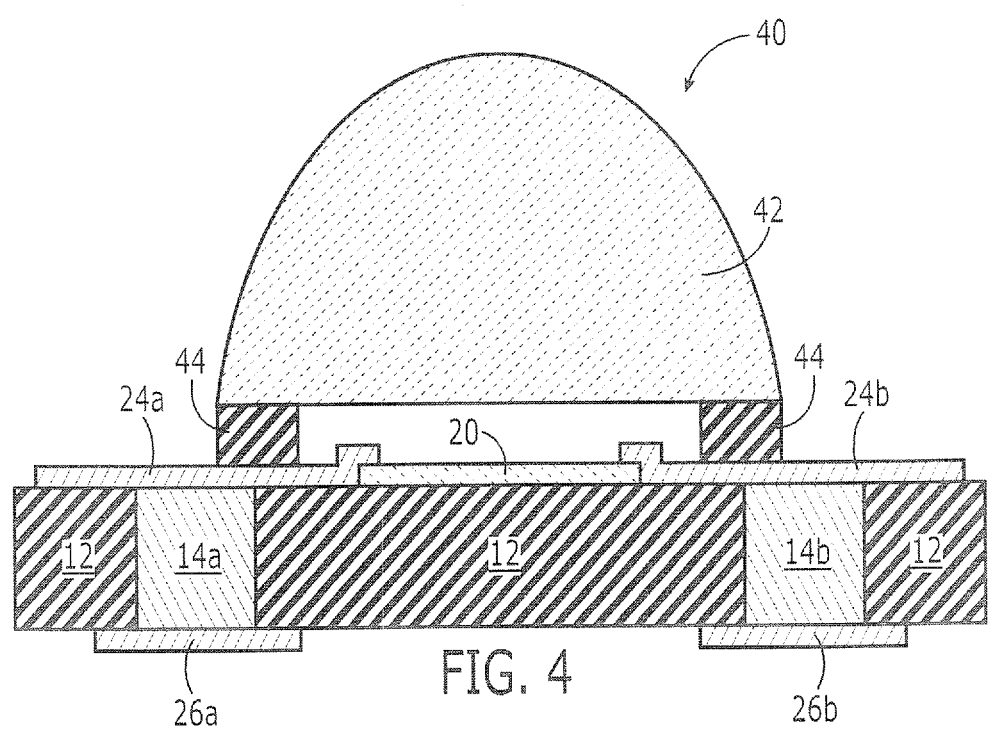
FIG. 4 is a cross-sectional view of a CPV sub-receiver with secondary lens element thereon, according to an embodiment of the invention.

The photovoltaic devices of FIGS. 1a-1c, 2 and 3a-3c may be utilized with optical elements that focus light onto an exposed light receiving surface 20a of a solar cell within the second substrate 20. For example, FIG. 4 illustrates a light receiving sub-receiver 40 having a light-converging optical element 42 therein that is supported opposite a first substrate 12 by a lens support device 44. This support device 44 may be a ring-shaped support that provides a hermetic seal with the optical element 42, as described more fully hereinbelow with respect to FIGS. 10a-10c.

Figure 5A:
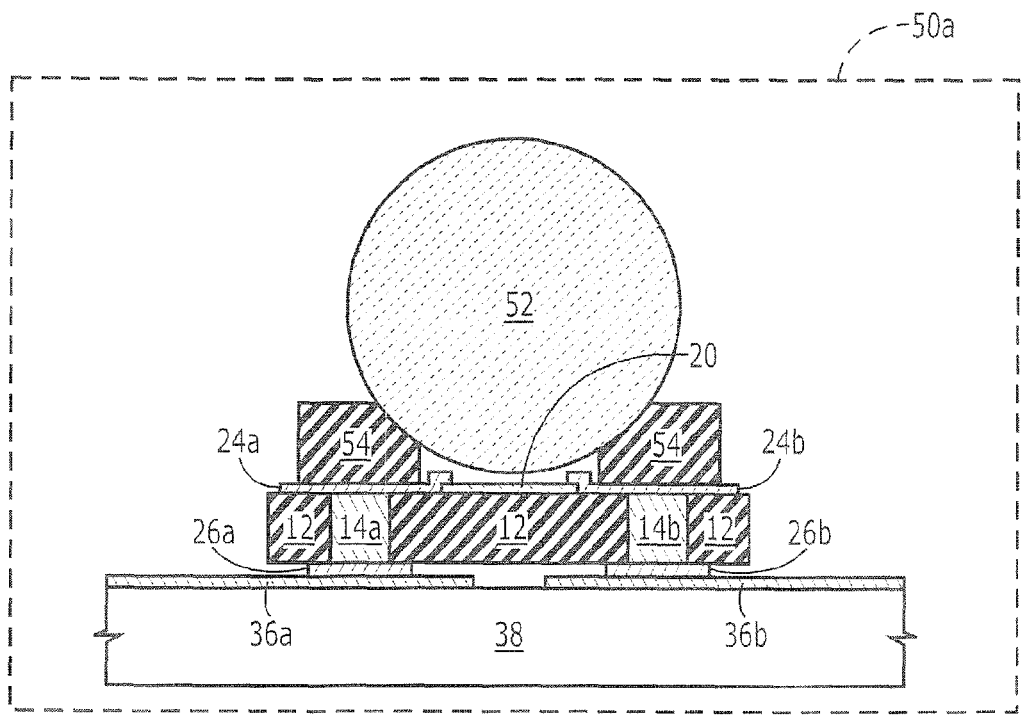
FIG. 5a is a cross-sectional view of a CPV sub-receiver mounted to an underlying backplane interconnect network, according to embodiments of the invention.
Figure 5B:
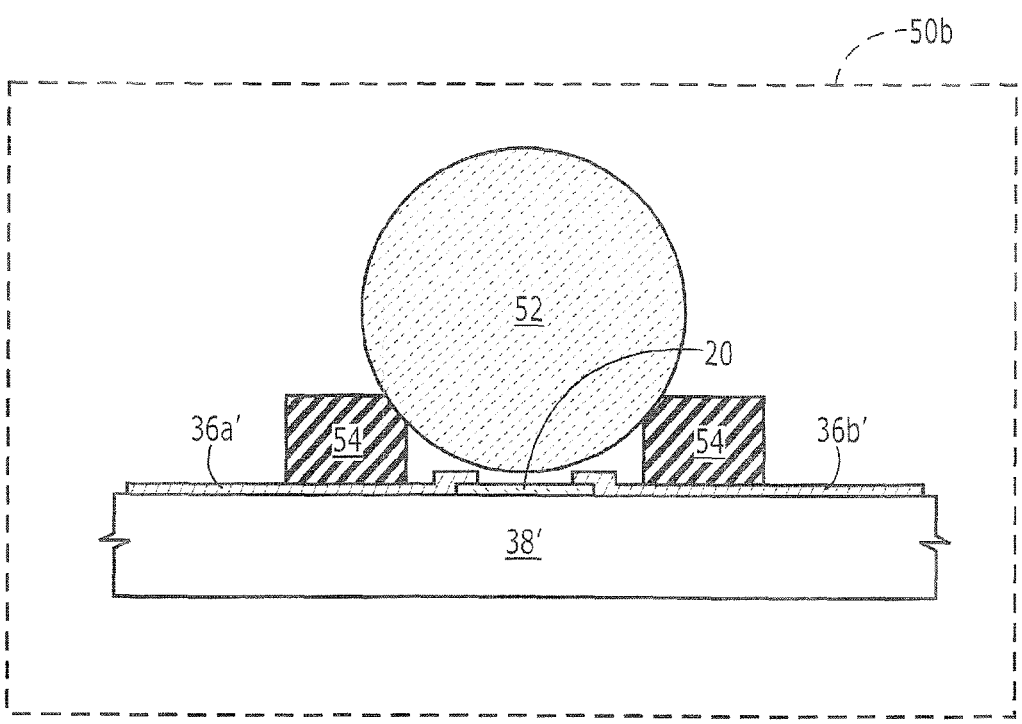
FIG. 5b is a cross-sectional view of a CPV receiver with secondary ball lens, according to an embodiment of the invention.

FIGS. 5a-5b illustrate additional light receiving sub-receivers 50a, 50b that utilize ball lenses 52 (e.g., glass lenses) instead of the light-converging optical element 42 of FIG. 4. In the sub-receiver configuration 50a of FIG. 5a, a ring-shaped lens support 54 is provided between the electrically conductive films 24a, 24b and a ball lens 52. The "self-centering" lens support 54 is positioned to align a center of the spherical ball lens 52 to a center of an underlying solar cell substrate 20. This solar cell substrate 20 is provided within a photovoltaic device 10 that is electrically and mechanically bonded to an underlying receiver substrate 38, which may operate as a monolithic backplane as described more fully hereinbelow. In contrast, the sub-receiver configuration 50b of FIG. 5b utilizes a ring-shaped lens support 54 that is mounted directly on an underlying receiver substrate 38' having first and second electrically conductive patterns 36a', 36b' (e.g., thick film metallization) thereon.

As will now be described with respect to FIGS. 6-9, embodiments of the invention may be utilized to produce large arrays of micro-solar cells that achieve large reductions in energy losses and wiring costs and provide higher voltage outputs. Moreover, the combination of micro-solar cells with monolithic backplane designs, as described herein, enable the use of surface mount equipment for the economical manufacture of CPV modules. Embodiments of the invention also enable the design of CPV modules having high reliability and extended life spans. In particular, embodiments of the invention are well suited for the manufacture of CPV systems that use ultra-thin solar cells (e.g., multi-junction cells) having substrate thicknesses of less than 20 microns, and even less than 12 microns. Embodiments of the invention may also utilize transfer printed solar cell substrates, such as those disclosed in the aforementioned '367 patent to Nuzzo et al. In particular, embodiments of the invention can be used in concentrator-type photovoltaic (CPV) modules, which are manufacturable with a reduced number of assembly steps using massively parallel assembly and interconnection processes. These embodiments can meet the objectives of providing CPV modules having increased reliability, functionality, efficiency, and weight advantages relative to prior art CPV modules. Moreover, the use of leadless CPV sub-receivers, such as those illustrated by FIGS. 1-5, can provide significant advantages over prior art sub-receivers. These advantages include: improved receiver performance resulting from the efficient dissipation of heat from sub-receiver surfaces upon which concentrated sunlight impinges; more efficient transfer of electrical power with lower $I^2R$ losses; and the accurate matching of solar cell output properties, which allow for efficient interconnections for large area array applications.

FIG. 6 illustrates a concentrator-type photovoltaic (CPV) module 65 according to an additional embodiment of the invention. This module is illustrated as including a back plate having a backplane interconnect network thereon that operates to electrically connect an array of solar cells together. According to some embodiments of the invention, an underlying receiver substrate 38' may be used as a component of the back plate. As illustrated by FIGS. 5a-5b and 6, light receiving sub-receivers 50b are provided at spaced locations on the receiver substrate 38'. These light receiving sub-receivers 50b may be electrically interconnected to provide a two-dimensional array of 1 mm$^2$ (or smaller) solar cell substrates 20, which have thicknesses of less than about 20 µm.

The backplane interconnect network 36a', 36b' is provided on the receiver substrate 38'. A front plate 60, which is supported by an outer frame 64, is provided in spaced-apart relation to the back plate. This front plate 60, which has an exterior face 60a on an outer panel 62a, is illustrated as including an array of primary lenses 62b thereon that are interior to the CPV module 65 and face the array of solar cell substrates 20. The outer panel 62a and array of primary lenses 62b may be configured as a contiguous or single piece of material (e.g., glass) or as a laminated composite of optically transparent material. According to some embodiments of the invention, the front plate 60 may be configured to provide a greater than 1000× lens-to-cell light concentration to the array of solar cells substrates 20. To achieve this 1000× lens-to-cell light concentration, the primary lenses 62b can be configured as plano-convex lenses having a lens sag of less than about 4 mm. In particular, the lenses can be configured to have a lens sag defined by the following relationship:

$$\text{sag} = f(n-1) - ((f(n-1))^2 - (\tfrac{1}{2}d)^2)^{1/2},$$

where "f" is the focal length of the lenses, "n" is refractive index of the lens material and "d" is the diameter of the lenses. As an example, an array of primary lenses 62b made from standard BK 7 optical glass (n~1.51) and having a lens focal length of 100 mm can yield a lens sag of less than 2 mm when the lenses have a diameter smaller than about 28 mm. Consequently, in order to achieve a CPV module having a concentration of at least 1000×, the solar cell substrates 20 should have light receiving area of less than 1 mm$^2$.

FIG. 7 is a plan view of a back plate 70 according to an embodiment of the invention. This back plate 70 is illustrated as including a receiver substrate 38 having a two-dimensional array of CPV sub-receivers 50a thereon. These sub-receivers 50a are electrically connected to the first and second large area electrically interconnects 36a, 36b, which make up a backplane interconnect network. These electrical interconnects may be formed as copper layers having thicknesses in a range from about 10 μm to about 50 μm. Over-voltage protection diodes 72 are also provided. The anode and cathode terminals of the diodes 72 are connected to the electrical interconnects 36a, 36b, as illustrated. These diodes 72 operate to limit the maximum amplitude of any reverse voltage appearing at a solar cell substrate 20 that is generating little (or no) current. For a CPV module providing a concentration ratio of 1000×, the number of solar cell substrates 20 will typically range from 1000 to 4000 per square meter of module aperture (for solar cells having a width in the 0.5 to 1 mm range). Because the output voltage generated by the solar cell substrates 20 is typically independent of substrate size, higher module output voltage can be achieved when large arrays of substrates 20 are connected as serial strings by proper patterning of the electrical interconnects 36a, 36b. Moreover, as described more fully hereinbelow with respect to FIGS. 9a-9b, the large area electrical interconnects 36a, 36b may operate to perform a heat sink function in addition to a low resistance electrical interconnect function.

FIG. 8 is a generalized cross-sectional view of a CPV module according to an additional embodiment of the invention. This generalized view illustrates how parallel paths of light received at an exterior face 60a of a front plate 60 are redirected into converging light paths 75a-75c by the primary lenses 62b located on an interior of the front plate 60. These converging light paths 75a-75c pass through respective secondary optical elements 52', which may be configured as spherical ball lenses (or refractive lenses). Each of these secondary optical elements 52' is mounted proximate a light receiving surface of a corresponding solar cell within a sub-receiver 50a. Although not wishing to be bound by any theory, it is expected that the use of a two stage light concentrator provided by the primary and second lenses can yield an optical transmission efficiency of higher than 80% when the primary and secondary lens elements are coated with anti-reflection coatings and a light acceptance angle of greater than ±1 degree.

These sub-receivers 50a may be electrically connected together on an underlying receiver substrate 38, as shown by FIG. 7. According to some embodiments of the invention, each of the secondary optical elements 52' may be configured to have a center-of-mass in substantial alignment with a center of the receiving surface of a corresponding solar cell substrate 20. These secondary optical elements 52' may be spherical lenses having a diameter of less than about 5 mm. In particular, a size, shape, composition and location of the secondary optical elements 52' relative to the underlying array of solar cell substrates 20 should be sufficient, in combination, to increase an acceptance angle of the CPV module relative to an otherwise equivalent module that lacks the array of secondary optical elements 52'.

FIGS. 9a-9b are cross-sectional views of receiver substrates 38' that advantageously enhance the heat sinking ability of at least some of the first and second electrically conductive patterns 36a', 36b' (e.g., thick and thin film metallization). As shown by FIG. 9a, electrically insulating release layers 39a may be formed between portions of the first and second electrically conductive patterns 36a', 36b' and the underlying substrate 38'. In addition, electrically insulating release layers 39b may be provided on a bottom surface of the receiver substrate 38' along with electrically conductive patterns 37 (e.g., thick film metallization), which cover portions of the release layers 39b.

In order to improve the efficiency of heat transfer to the ambient within a CPV module (by radiation and convection), portions of the first and second electrically conductive patterns 36a', 36b' and patterns 37 can be partially released from the underlying substrate 38'. For example, as illustrated by FIG. 9b, the release layers 39a, 39b can be patterned and then removed (e.g., by etching) to thereby selectively release portions of the metal patterns 36a', 36b' and 37 from the substrate 38'. Although not wishing to be bound by any theory, the metal patterns 36a', 36b' and 37 may be deposited to have internal stresses therein. These stresses can be tailored to provide a controlled "lift-off" of portions of the patterns (e.g., heat sink "fins") when the release layers 39a, 39b are removed. These portions of the patterns are highlighted by the reference numerals 36a", 36b" and 37' in FIG. 9b.

Figure 10A:
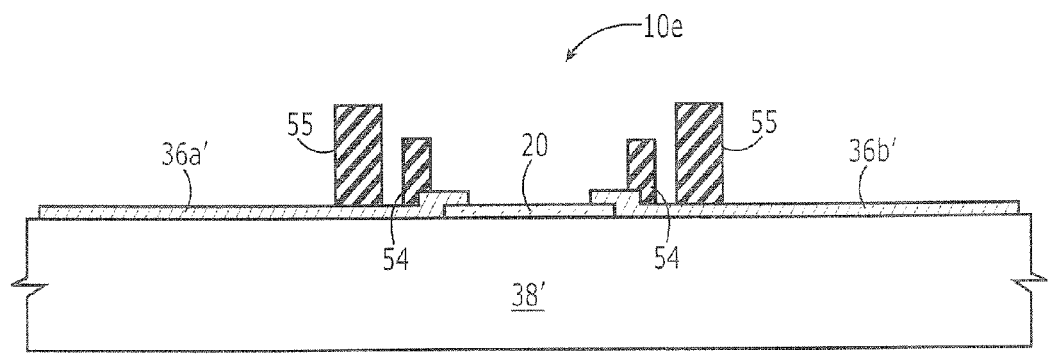
FIGS. 10a-10c are cross-sectional views that illustrate CPV receivers according to embodiments of the invention.
Figure 10B:
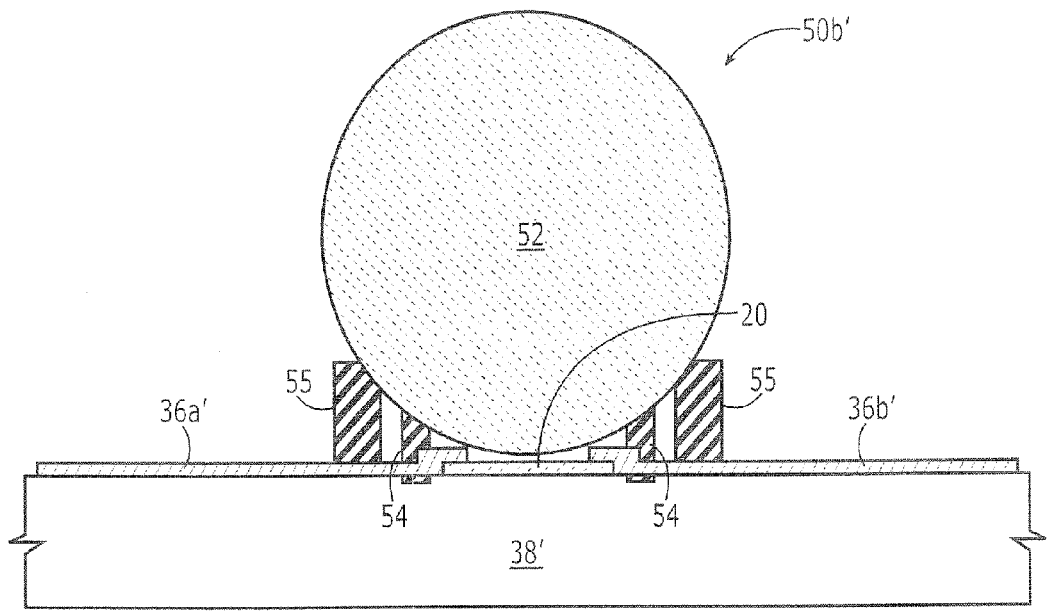
Figure 10C:
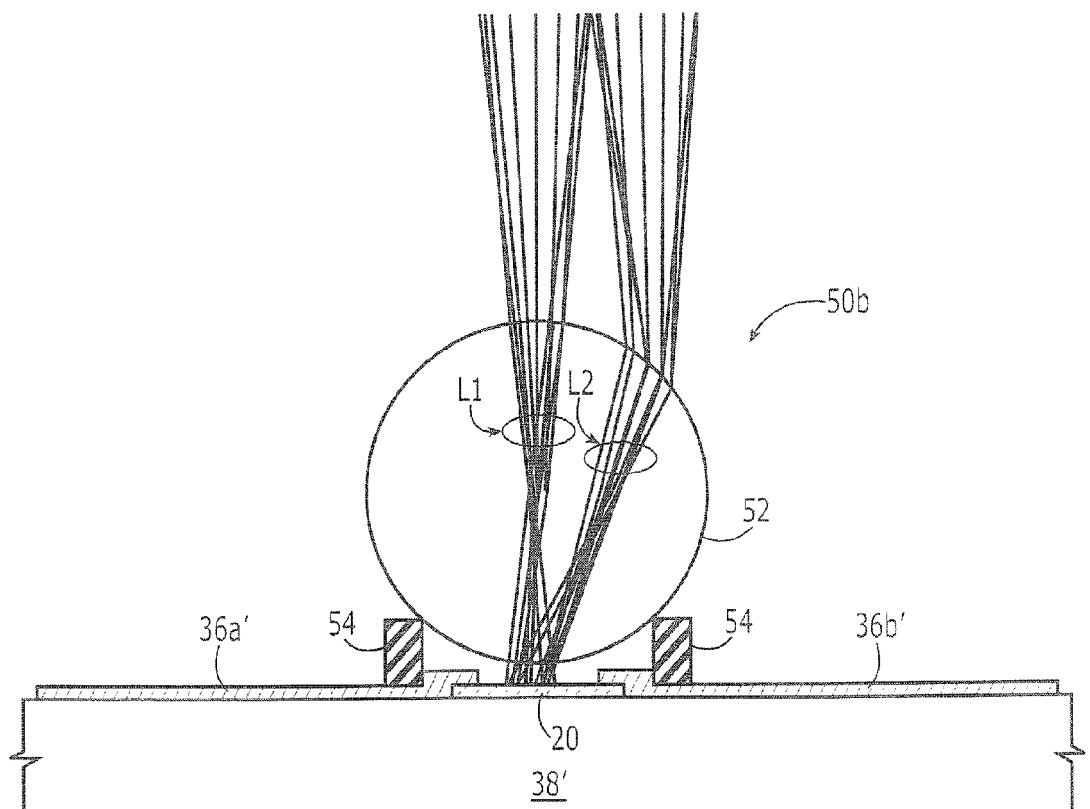

FIGS. 10a-10c illustrate methods of forming concentrator-type photovoltaic (CPV) receivers according to additional embodiments of the invention. In particular, FIG. 10a illustrates a photovoltaic device 10e having a solar cell substrate 20 positioned on an underlying receiver substrate 38'. First and second electrically conductive patterns 36a' and 36b' are also provided on the receiver substrate 38' and on terminals (e.g., anode, cathode) of the solar cell substrate, as described hereinabove. First and second self-centering lens supports 54 and 55 are provided on the first and second electrically conductive patterns 36a and 36b'. These first and second lens supports 54 and 55 may be patterned as ring-shape support/sealing structures that are concentrically arranged relative to each other and have openings that expose a light receiving surface of the solar cell substrate 20.

As illustrated by FIG. 10b, a spherical lens 52 is formed on the self-centering lens supports 54, 55, to thereby define a sub-receiver 50b'. In some of these embodiments of the invention, the spherical lens 52 can be sealed to the openings in the self-centering lens supports 54, 55. Preferably, the seal that is provided is a hermetic seal. The sealing operation may include annealing the spherical lens 52 and the self-centering lens supports 54, 55 at a temperature in a range from about 150° C. to about 350° C. This annealing of the lens 52 and lens supports 54, 55 may be performed in a chemically inert ambient. Examples of chemically inert ambients include nitrogen and/or argon ambients, which may be free of oxygen.

FIG. 10c illustrates a sub-receiver 50b having a spherical lens 52 that is mounted on a self-centering lens support 54. As illustrated by the light paths illustrated by the reference characters L1 and L2, a high accuracy of alignment between the lens 52 and solar cell substrate 20, as provided by the self-centering lens support 54, can be used to improve the light collection efficiency of the sub-receiver 50b by redirecting off-center light to the light receiving surface of the solar cell substrate 20, as highlighted by the reference character L2.

Figure 11A:
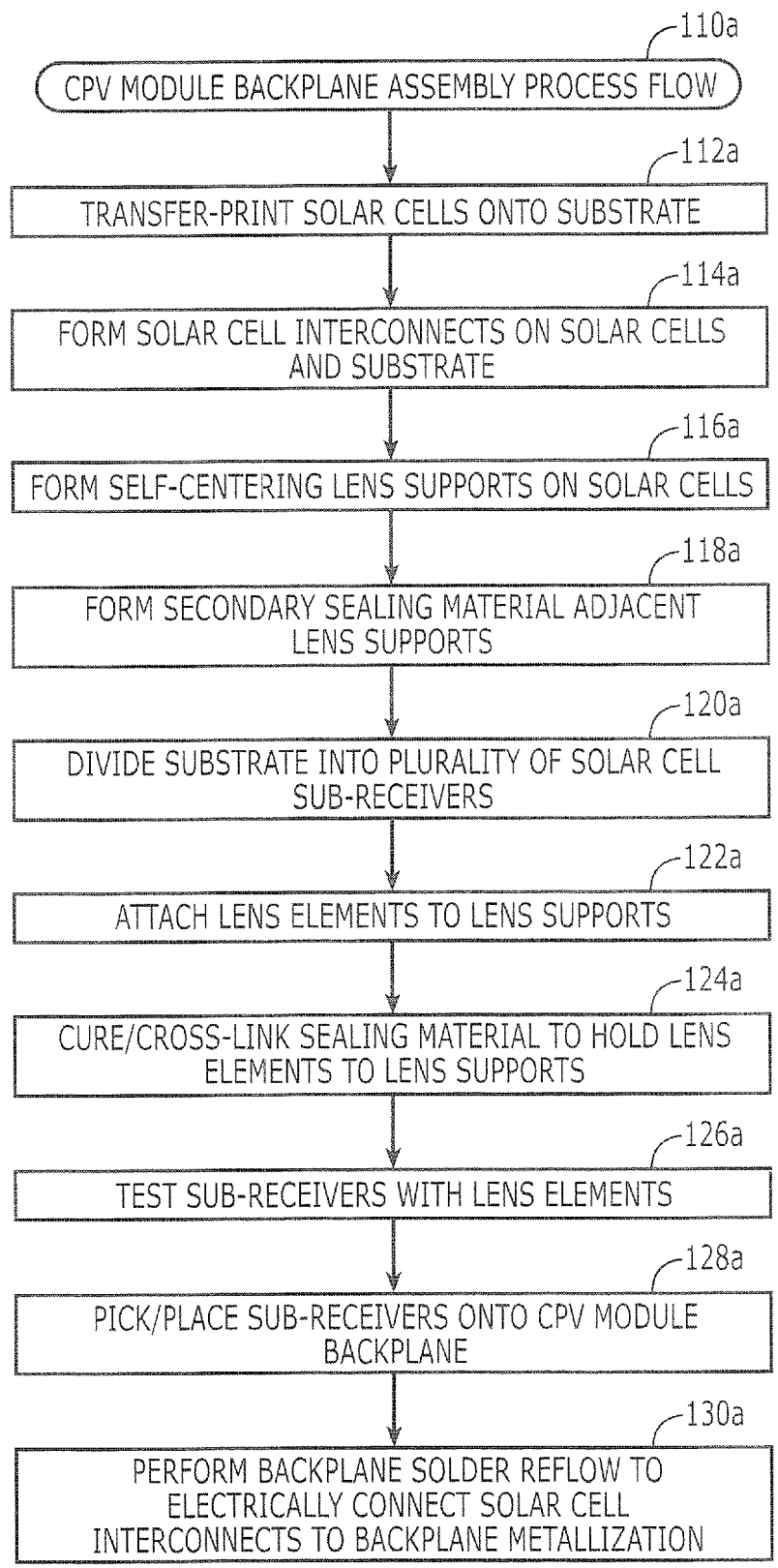
FIGS. 11a-11c are flow diagrams that illustrate CPV backplane assembly processes according to embodiments of the invention.
Figure 11B:
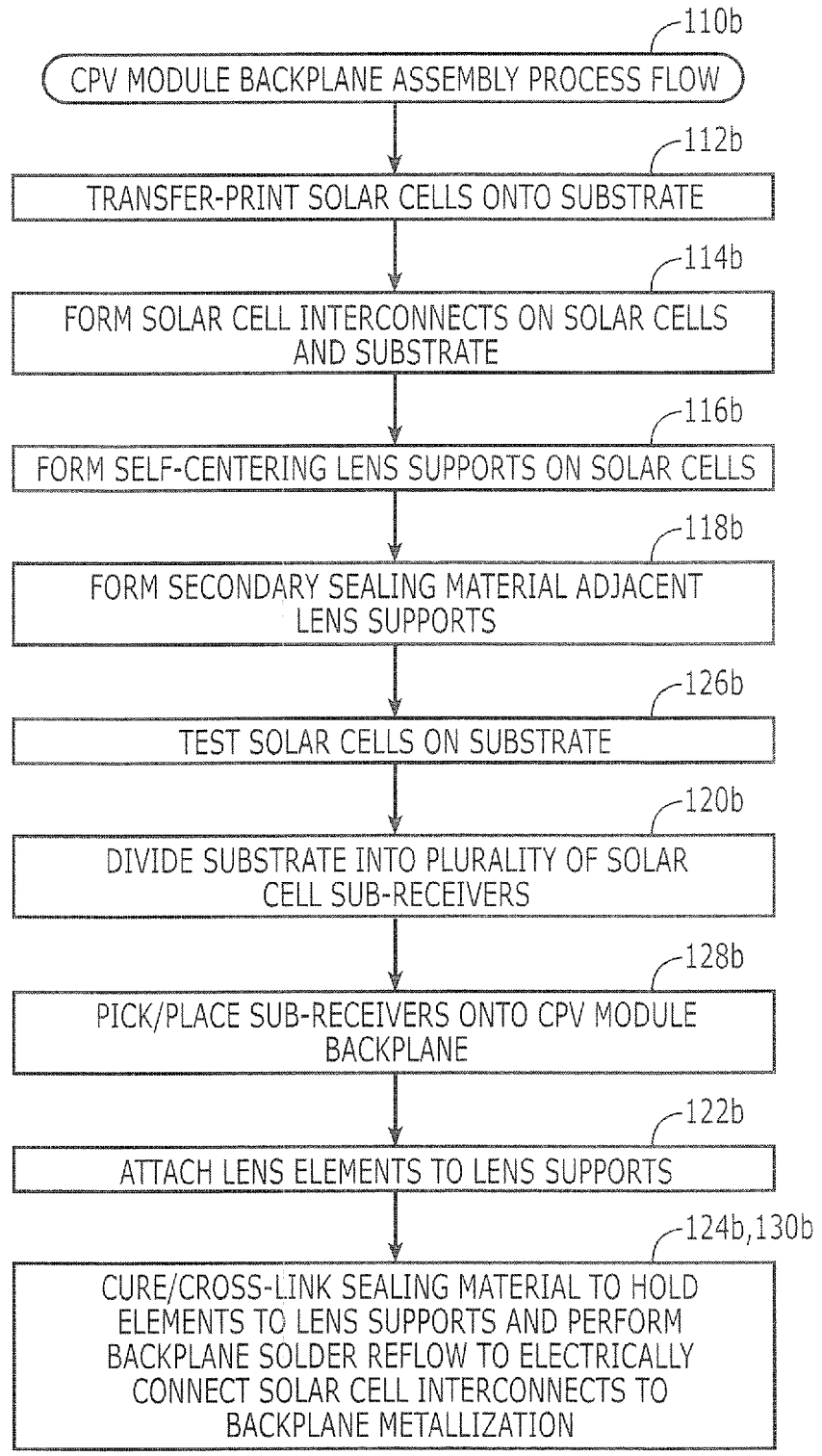
Figure 11C:
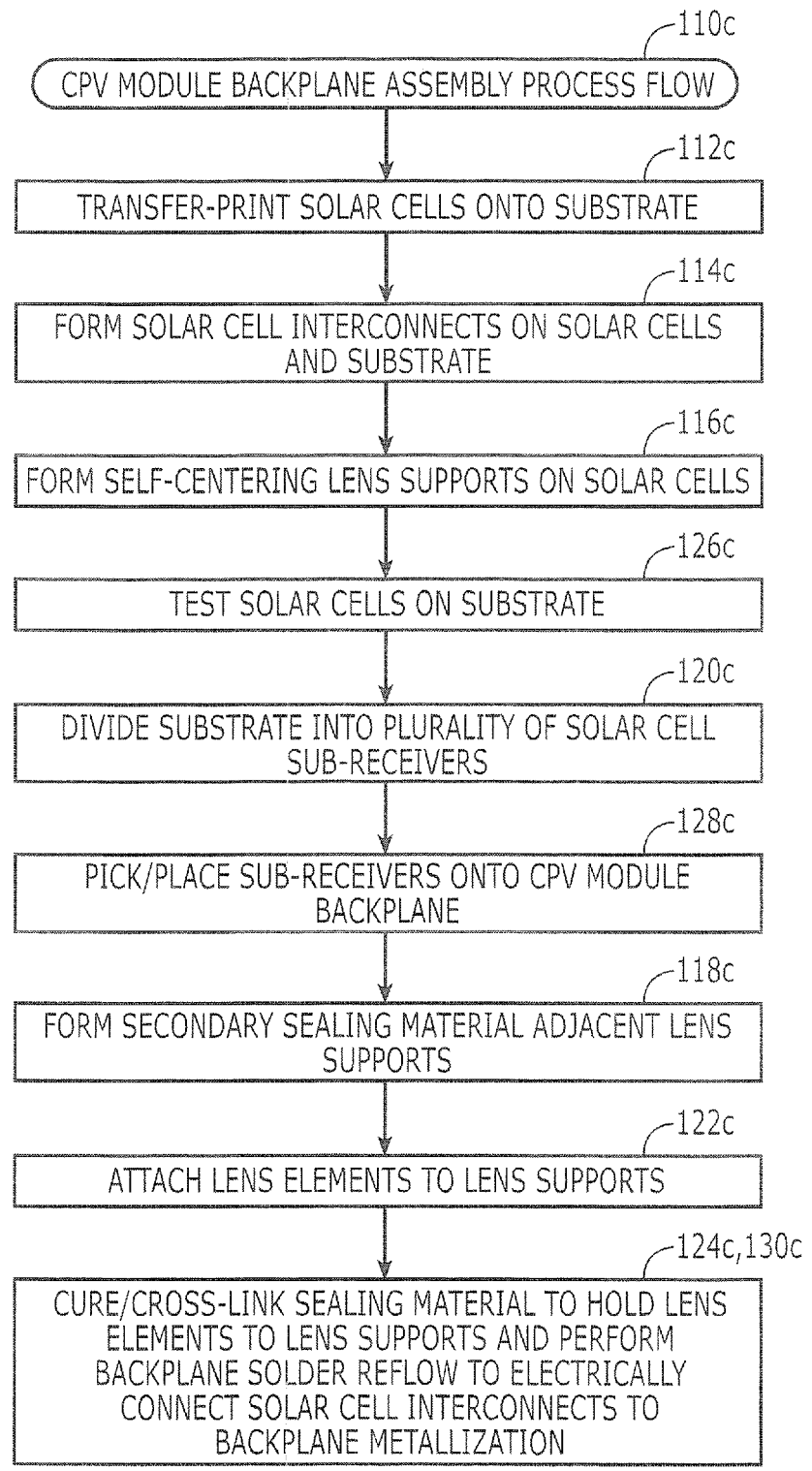

FIGS. 11a-11c are flow diagrams that illustrate CPV backplane assembly processes according to additional embodiments of the invention. As illustrated by FIG. 11a, an assembly process 110a may include depositing solar cells onto a substrate (e.g., silicon wafer substrate) using a transfer printing technique, Block 112a. One example of a transfer printing technique is disclosed in the aforementioned '367 patent to Nuzzo et al. Thereafter, metal deposition and patterning steps may be performed to define electrical interconnects that contact terminals of the solar cells to respective regions on the substrate (e.g., through-substrate conductive vias), Block 114a. Steps may also be performed to define self-centering lens supports on the solar cells and sealing patterns adjacent the lens supports, Blocks 116a, 118a. As described hereinabove with respect to FIGS.

5-6 and 10a-10c, the self-centering lens supports may be formed as ring-shaped supports and the sealing patterns may be formed by depositing and patterning rings of sealing material that are concentrically arranged relative to respective lens supports.

As illustrated by Block 120a, the substrate (e.g., wafer) is then divided (e.g., along scribe lines) into a plurality of photovoltaic devices, such as those illustrated by FIG. 1a. As described herein, these photovoltaic devices may operate as solar cell sub-receivers. These steps to divide the substrate may be followed by steps to attach lens elements to the self-centering lens supports and then cure/cross-link the sealing patterns (e.g., using heat treatment) to hermetically seal the lens elements to the lens supports, Blocks 122a, 124a. In particular, the lens elements (e.g., spherical lenses) and sealing patterns may be annealed in a chemically inert ambient at a temperature in a range from about 150° C. to about 350° C. This chemically inert ambient may be an oxygen-free ambient comprising nitrogen and/or argon. The sub-receivers with lens elements (e.g., ball lenses) may then be functionally tested, Block 126a. Sub-receivers having passed the functional tests may then be placed onto a CPV module backplane in a two-dimensional array pattern, Block 128a. As illustrated by FIGS. 1c and 5a, a backplane solder reflow operation may be performed to electrically connect solar cell interconnects (e.g., output pads 26a, 26b) to backplane metallization (e.g., patterns 36a, 36b), Block 130a.

Referring now to FIG. 11b, an alternative assembly process 110b may include depositing solar cells onto a substrate (e.g., silicon wafer substrate) using a transfer printing technique, Block 112b. One example of a transfer printing technique is disclosed in the aforementioned '367 patent to Nuzzo et al. Thereafter, metal deposition and patterning steps may be performed to define electrical interconnects that contact terminals of the solar cells to respective regions on the substrate (e.g., through-substrate conductive vias), Block 114b. Steps may also be performed to define self-centering lens supports on the solar cells and sealing patterns adjacent the lens supports, Blocks 116b, 118b. As described hereinabove with respect to FIGS. 5-6 and 10a-10c, the self-centering lens supports may be formed as ring-shaped supports and the sealing patterns may be formed by depositing and patterning rings of sealing material that are concentrically arranged relative to respective lens supports.

As illustrated by Block 126b, the solar cells and electrical interconnects may be tested at the "wafer" level to identify passing and failing devices. Next, as illustrated by Block 120b, the substrate (e.g., wafer) is then divided (e.g., along scribe lines) into a plurality of sub-receiver devices. The "passing" devices may then be placed onto a CPV module backplane in a two-dimensional array pattern, Block 128b. As illustrated by Block 122b, lens elements are attached to the self-centering lens supports. A heat treatment step may then be performed to: (i) cure/cross-link the sealing patterns to hermetically seal the lens elements to the lens supports; and (ii) enable backplane solder reflow, which electrically connects the solar cell interconnects (e.g., output pads 26a, 26b) to backplane metallization (e.g., patterns 36a, 36b), Blocks 124b, 130b.

Referring now to FIG. 11c, an additional assembly process 110c may include depositing solar cells onto a substrate (e.g., silicon wafer substrate) using a transfer printing technique, Block 112c. Thereafter, metal deposition and patterning steps may be performed to define electrical interconnects that contact terminals of the solar cells to respective regions on the substrate (e.g., through-substrate conductive vias), Block 114c. Steps may also be performed to define self-centering lens supports on the solar cells, Block 116c. As illustrated by Block 126c, the solar cells and electrical interconnects may be tested at the "wafer" level to identify passing and failing devices. Next, as illustrated by Block 120c, the substrate (e.g., wafer) is then divided (e.g., along scribe lines) into a plurality of sub-receiver devices. The "passing" devices may then be placed onto a CPV module backplane in a two-dimensional array pattern, Block 128c. As illustrated by Blocks 118c and 122c, sealing patterns are formed adjacent the lens supports and then lens elements are attached to the self-centering lens supports. Next, a heat treatment step can be performed to: (i) cure/cross-link the sealing patterns to hermetically seal the lens elements to the lens supports; and (ii) enable backplane solder reflow, which electrically connects the solar cell interconnects (e.g., output pads 26a, 26b) to backplane metallization (e.g., patterns 36a, 36b), Blocks 124c, 130c.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A concentrator-type photovoltaic (CPV) module, comprising:
a back plate having an array of sub receivers comprising a non-conductive material assembled thereon, the sub receivers including respective transfer printed semiconductor solar cells on respective first surfaces thereof and electrically conductive film interconnects forming a patterned layer exclusively extending along, directly on, and in direct contact with the respective first surface and the respective solar cells to contact respective terminals of the respective solar cells on the respective first surfaces, the electrically conductive film interconnects extending directly on and over a periphery of the respective solar cells and onto the respective first surfaces, the sub receivers further including electrically conductive planar output pads separate from the film interconnects that are spaced apart and only on respective second surfaces thereof opposite the respective first surfaces and adjacent the back plate, wherein respective ones of the output pads are electrically coupled to respective ones of the terminals of the respective solar cells by the film interconnects through respective electrically conductive vias in the sub receivers, wherein the electrically conductive film interconnects extend along and are directly on and in direct contact with the respective electrically conductive vias in the sub receivers, and wherein a light receiving surface of a respective one of the solar cells is less than 1 mm$^2$ and the respective one of the solar cells has a thickness of less than about 20 microns;
a backplane interconnect network electrically connecting the solar cells together, on said back plate; and
a front plate spaced-apart from said back plate, said front plate having an array of primary lenses thereon that face the solar cells and provide a greater than 1000+ lens-to-cell light concentration to the solar cells.

2. The CPV module of claim 1, wherein the primary lenses are piano-convex lenses having a lens sag of less than about 4 mm.

3. The CPV module of claim 2, wherein the lens sag of the plano-convex lenses is defined by the following relationship:

$$\text{sag} = f(n-1) - ((f(n-1))^2 - (1/2d)^2)^{1/2}$$

where f is the focal length of the lenses, n is refractive index of the lenses and d is the diameter of the lenses.

4. The CPV module of claim 1, further comprising an array of secondary optical elements extending between the array of primary lenses and the array of solar cells, wherein the secondary optical elements have a diameter less than 5 mm.

5. The CPV module of claim 4, wherein each of the secondary optical elements is mounted proximate the light receiving surface of a corresponding solar cell.

6. The CPV module of claim 5, wherein each of the secondary optical elements has a center-of-mass in substantial alignment with a center of the receiving surfaces of a corresponding solar cell.

7. The CPV module of claim 6, wherein the sub receivers respectively include:
a self-centering lens support structure mounted on the first surface of a respective one of the sub receivers and configured to suspend a respective one of the secondary optical elements over a respective one of the solar cells, wherein the secondary optical elements are spherical lenses having a diameter of less than about 5 mm.

8. The CPV module of claim 7, wherein a size, shape, composition and location of the secondary optical elements relative to the array of solar cells are sufficient, in combination, to increase an acceptance angle of the CPV module relative to an otherwise equivalent module that lacks the array of secondary optical elements.

9. A concentrator-type photovoltaic (CPV) module, comprising:
a front plate having an array of primary lenses thereon;
a back plate having an array of sub receivers comprising a non-conductive material assembled thereon, the sub receivers including respective transfer printed semiconductor solar cells thereon that face the array of primary lenses, the sub receivers including non-planar electrically conductive film interconnects forming a patterned layer exclusively extending along, directly on, and in direct contact with respective first surfaces and the respective solar cells to contact terminals of the respective solar cells on the respective first surfaces thereon, the electrically conductive film interconnects extending directly on and over a periphery of the respective solar cells and onto the respective first surfaces, the sub receivers further including electrically conductive planar output pads separate from the film interconnects that are spaced apart and only on respective second surfaces thereof opposite the respective first surfaces and adjacent the back plate, wherein respective ones of the output pads are electrically coupled to respective ones of the terminals of the respective solar cells by the film interconnects through respective electrically conductive vias in the sub receivers, wherein the electrically conductive film interconnects extend along and are directly on and in direct contact with the respective electrically conductive vias in the sub receivers, each of the solar cells having a light receiving area of less than 1 mm$^2$ and the respective one of the solar cells has a thickness of less than 20 microns;
an array of secondary optical elements extending between the array of primary lenses and the array of solar cells, wherein the secondary optical elements have a diameter less than 5 mm; and
a backplane electrically connecting the array of solar cells together, extending between said back plate and the array of solar cells.

10. The CPV module of claim 9, wherein said backplane comprises first and second interconnect networks electrically connected to first and second terminals of the array of solar cells, respectively.

11. The CPV module of claim 10, further comprising a plurality of over-voltage protection diodes having cathode terminals electrically connected to the first interconnect network and anode terminals electrically connected to the second interconnect network.

12. The CPV module of claim 9, wherein said front plate has a first light receiving surface thereon; and wherein each of a plurality of the primary lenses is configured to concentrate light received at the first surface of said front plate to a corresponding optical element in said array of secondary optical elements.

13. The CPV module of claim 12, wherein each of a plurality of the secondary optical elements is further configured to concentrate light received from the array of primary lenses to a light receiving surface of a corresponding solar cell in the array of solar cells.

14. The CPV module of claim 9, further comprising a frame mounted to said back plate, said frame configured to support said front plate opposite the array of solar cells.

15. The CPV module of claim 9, wherein said front plate and the array of primary lenses are configured as a contiguous piece of optically transparent material.

16. The CPV module of claim 9, wherein said front plate and the array of primary lenses are configured as a composite of optically transparent materials.

17. The CPV module of claim 9, wherein the array of primary lenses is laminated or molded onto an interior surface of said front plate.

18. The CPV module of claim 12, wherein said front plate and the array of primary lenses are configured as a composite of optically transparent materials; and
wherein the array of primary lenses is laminated or molded onto an interior surface of said front plate.

19. The CPV module of claim 9, wherein the primary lenses are piano-convex lenses.

20. The CPV module of claim 10, wherein said first and/or second interconnect network comprises at least one metal layer.

21. The CPV module of claim 20, wherein said first and/or second interconnect network comprises a copper layer having a thickness in a range from about 10 µm to about 50 µm.

22. The CPV module of claim 20, wherein said first and/or second interconnect network comprises a first partially-released metal layer on a primary surface of said back plate, the first partially-released metal layer comprising a portion that is free of attachment to and protrudes opposite to the primary surface of said back plate.

23. The CPV module of claim 22, wherein the first partially-released metal layer is configured to operate as a heat sink for the array of solar cells.

24. The CPV module of claim 23, further comprising a second partially-released metal layer on a secondary surface of said back plate that extends opposite the primary surface of said back plate and operates as a heat sink for the back plate, the second partially-released metal layer comprising a portion that is free of attachment to and protrudes opposite to the secondary surface of said back plate.

25. The CPV module of claim 9, wherein each of the plurality of the secondary optical elements has a convex surface facing a respective one of the plurality of the primary lenses and a convex surface facing an underlying solar cell in the array of solar cells.

26. The CPV module of claim 7, wherein each of the spherical lenses is sealed to a respective opening in the corresponding the self-centering lens support structure mounted on the first surface of the corresponding sub receiver.

\* \* \* \* \*